(12) United States Patent
Akiyoshi

(10) Patent No.: US 7,978,550 B2
(45) Date of Patent: Jul. 12, 2011

(54) SEMICONDUCTOR MEMORY

(75) Inventor: Hideo Akiyoshi, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 114 days.

(21) Appl. No.: 12/544,067

(22) Filed: Aug. 19, 2009

(65) Prior Publication Data
US 2010/0080073 A1    Apr. 1, 2010

(30) Foreign Application Priority Data
Sep. 26, 2008   (JP) ................................ 2008-247622

(51) Int. Cl.
G11C 29/00    (2006.01)
(52) U.S. Cl. ....................................... 365/200; 365/201
(58) Field of Classification Search .................. 365/200, 365/201
See application file for complete search history.

(56) References Cited

U.S. PATENT DOCUMENTS 5,550,394 A * 8/1996 Sukegawa et al. ............ 257/209
7,281,155 B1 10/2007 Eto et al.
2002/0031017 A1 * 3/2002 Yumoto ........................ 365/200
2008/0126876 A1 * 5/2008 Lee ................................. 714/42

FOREIGN PATENT DOCUMENTS

JP    2000-100191 A    4/2000
JP    2001-006389 A    1/2001

* cited by examiner

*Primary Examiner* — Anh Phung
(74) *Attorney, Agent, or Firm* — Arent Fox LLP

(57) ABSTRACT

A semiconductor memory includes: a plurality of regular memory cells; a first redundant memory cell; a second redundant memory cell; a first redundancy program circuit, first defect position information indicating a position of a first defective regular memory cell being programmed into the first redundancy program circuit; a second redundancy program circuit, second defect position information indicating a position of a second defective regular memory cell being programmed into the second redundancy program circuit; a redundancy switch circuit which couples signal lines to the regular memory cell, the first redundant memory cell, and the second redundant memory cell; and a redundancy signal switch circuit which replaces the first defect position information and the second defect position information with each other when the second defective regular memory cell is located between the first defective regular memory cell and the first redundant memory cell.

10 Claims, 16 Drawing Sheets

SEMICONDUCTOR MEMORY

CROSS-REFERENCE TO RELATED APPLICATIONS

This application claims the benefit of priority from Japanese Patent Application No. 2008-247622 filed on Sep. 26, 2009, the entire contents of which are incorporated herein by reference.

BACKGROUND

1. Field

Embodiments discussed herein relate to a semiconductor memory.

2. Description of Related Art

In semiconductor memories, a circuit including a defect is replaced with, for example, a redundant circuit to remedy the defect. A redundant circuit system includes a shift redundancy system. In the shift redundancy system, for example, a switch circuit which operates in response to a defect position signal couples an output of a decoder circuit to a selection line other than a defective selection line. Related art is disclosed in Japanese Laid-open Patent Publication No. 2000-100191, Japanese Laid-open Patent Publication No. 2001-6389, or the like.

SUMMARY

According to one aspect of embodiments, a semiconductor memory includes: a plurality of regular memory cells; a first redundant memory cell which is arranged at one end of a region of the regular memory cells; a second redundant memory cell which is arranged at the other end of the region of the regular memory cells; a first redundancy program circuit corresponding to the first redundant memory cell, first defect position information indicating a position of a first defective regular memory cell being programmed into the first redundancy program circuit; a second redundancy program circuit corresponding to the second redundant memory cell, second defect position information indicating a position of a second defective regular memory cell being programmed into the second redundancy program circuit; a redundancy switch circuit which couples signal lines to the regular memory cell, the first redundant memory cell, and the second redundant memory cell in response to the first defect position information and the second defect position information; and a redundancy signal switch circuit which replaces the first defect position information and the second defect position information with each other when the second defective regular memory cell is located between the first defective regular memory cell and the first redundant memory cell.

Additional advantages and novel features of the invention will be set forth in part in the description that follows, and in part will become more apparent to those skilled in the art upon examination of the following or upon learning by practice of the invention.

DETAILED DESCRIPTION

In a manufacturing process of a semiconductor memory, for example, a test is carried out at a high temperature and a low temperature. A defect is remedied by using one redundant circuit based on a first test result, while a defect is remedied by using another redundant circuit based on a subsequent test result. That is, irrespective of the position of the defect remedied first, the defect detected by the subsequent test is remedied. For example, in a shift redundancy system, even when the defect detected by the subsequent test is located between the defect detected first and a redundant circuit used to remedy the defect detected first, the defect detected by the subsequent test is remedied.

In the Figures, signal lines illustrated in bold indicate that a plurality of signal lines are provided. A portion of a block to which the bold line is coupled includes a plurality of circuits. Signal lines are labeled with reference symbols representing names of signals transmitted through the signal lines. A signal having a reference symbol prefixed with a symbol "/" indicates a negative logic. A double-square symbol represents an external terminal, such as a pad on a semiconductor chip or a lead of a package containing the semiconductor chip therein. Terminals and signals supplied through the terminals, respectively, are denoted by like reference symbols.

Figure 1:
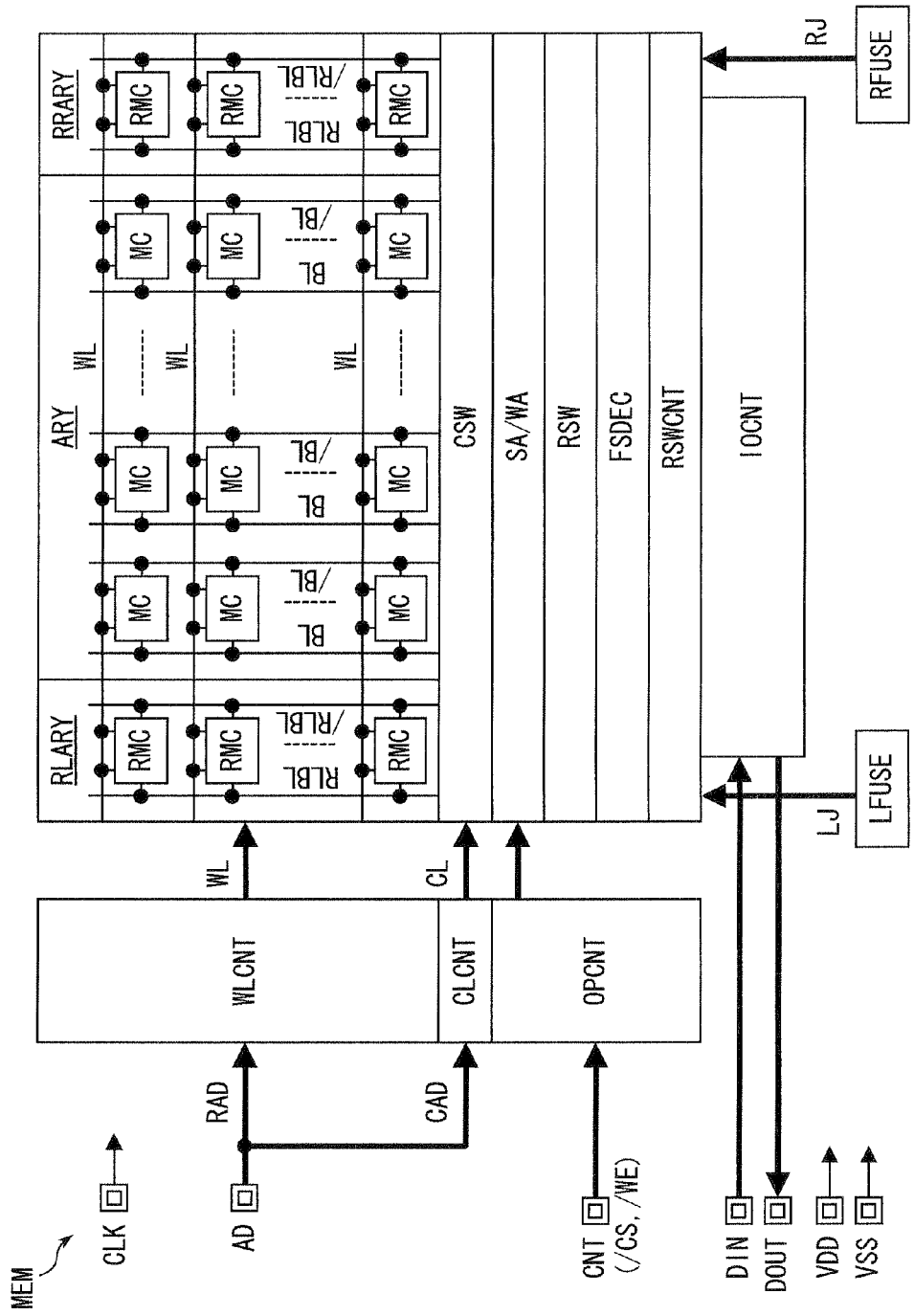
FIG. 1 illustrates various exemplary features in accordance with a first variation.

FIG. 1 illustrates a first variation comprising a memory MEM. For example, the memory MEM may be as semiconductor memory, such as an SRAM. The memory MEM may be a semiconductor memory device enclosed in a package or may be a memory macro (IP) mounted on a system LSI or the like. The memory MEM may be a clock synchronous type or a clock asynchronous type.

The memory MEM is formed on a silicon substrate by using a CMOS process, for example. The memory MEM includes a word control circuit WLCNT, a column control circuit CLCNT, an operation control circuit OPCNT, a regular cell array ARY, redundant cell arrays RLARY and RRARY, a column switch circuit CSW, a sense amplifier circuit SA, a write amplifier circuit WA, a redundancy switch circuit RSW, a fuse decoder circuit FSDEC, a redundancy signal switch circuit RSWCNT, an input and output control circuit IOCNT, and redundancy program circuits LFUSE and RFUSE. The word control circuit WLCNT, the column control circuit CLCNT, the operation control circuit OPCNT, and the input and output control circuit IOCNT may operate in synchronization with a clock signal CLK. The memory MEM includes an input buffer which receives an address signal AD and a control signal CNT.

The word control circuit WLCNT decodes the higher-order bit of the address signal AD, which may be, for example, a raw address RAD, and activates one of word lines WL indicated by the raw address RAD to a high level in a read operation and a write operation. The column control circuit CLCNT decodes the lower-order bit of the address signal AD, which may be, for example, a column address CAD, and activates one of the column selection signals CL, indicated by the column address CAD, to a high level in a read operation and a write operation.

The operation control circuit OPCNT decodes, for example, the control signal CNT, such as a chip select signal /CS or a write enable signal /WE and generates a plurality of control signals for executing a read operation and a write operation, which may include, for example, a timing signal. The control signals are supplied to the word control circuit WLCNT, the column control circuit CLCNT, the sense amplifier circuit SA, the write amplifier circuit WA, the input and output control circuit IOCNT, or the like.

The regular cell array ARY includes a plurality of regular memory cells arranged in a matrix form, such as static memory cells MC. The memory cells MC arranged in the horizontal direction in FIG. 1 are coupled to the common word line WL. The memory cells MC arranged in the vertical direction in FIG. 1 are coupled to a common regular bit line pair BL and /BL. The redundant cell array RLARY includes redundant memory cells RMC coupled to a common redundant bit line pair RLBL and /RLBL and arranged in the vertical direction in FIG. 1. The redundant cell array RRARY includes the redundant memory cells RMC coupled to a common redundant bit line pair RRBL and /RRBL and arranged in the vertical direction in FIG. 1.

The column switch circuit CSW includes column switches, which couple the bit line pair BL and /BL, the bit line pair RLBL and /RLBL, and the bit line pair RRBL and /RRBL to the sense amplifier circuit SA and the write amplifier circuit WA. The column switches are turned ON when the corresponding column selection signals CL are at a high level and couple the bit line pairs BL and /BL, RLBL and /RLBL, and RRBL and /RRBL, indicated by the column address CAD to data lines.

The sense amplifier circuit SA includes a plurality of sense amplifiers coupled to data lines. For example, the sense amplifiers amplify the respective voltage differences between the bit line pair BL and /BL, between the bit line pair RLBL and /RLBL, and between the bit line pair RRBL and /RRBL coupled to the sense amplifiers via the column switches, to thereby determine a logic of data read from the memory cells MC and the redundant memory cells RMC. The write amplifier circuit WA includes a plurality of write amplifiers coupled to data lines. The write amplifiers output write data to each of the bit line pair BL and /BL, the bit line pair RLBL and /RLBL, and the bit line pair RRBL and /RRBL coupled to the write amplifiers via the column switches.

The input and output control circuit IOCNT outputs a plurality of bits of read data, determined by the sense amplifier circuit SA, to a data output terminal DOUT in a read operation. The input and output control circuit IOCNT outputs write data supplied to a data input terminal DIN to the bit line pair BL and /BL, the bit line pair RLBL and /RLBL, and the bit line pair RRBL and /RRBL selected by the column switches. The input and output of the data terminal may be in common.

The redundancy program circuit LFUSE is disposed corresponding to the redundant cell array RLARY and includes a fuse, in which information indicating a position of a defective bit line pair BL and /BL is programmed. The redundancy program circuit LFUSE outputs a programmed value as a defect position signal LJ. The redundancy program circuit RFUSE is disposed corresponding to the redundant cell array RRARY and includes a fuse, in which information indicating a position of a defective bit line pair BL and /BL is programmed. The redundancy program circuit RFUSE outputs a programmed value as a defect position signal RJ. When the memory cell MC is defective, the defect position signals LJ and RJ indicate the position of the bit line pair BL and /BL coupled to the defective memory cell MC. A defect of the memory cell MC may be regarded as a defect of the bit line pair BL and /BL. A defect of the bit line pair BL and /BL may be regarded as a defect of the memory cell MC.

The fuse may be a laser fuse or an electric fuse. A laser fuse is cut by a laser processing apparatus in the manufacturing process of the memory MEM, for example, in a test process. An electric fuse is cut by a fuse program circuit disposed in the memory MEM. The fuse program circuit becomes effective when the memory MEM enters a test mode and is cut by a current flowing in response to defect position information supplied from an outside of the memory MEM. The redundancy program circuits LFUSE and RFUSE may be formed by using a non-volatile memory cell.

When the value of the defect position signal RJ is smaller than the value of the defect position signal LJ, the redundancy signal switch circuit RSWCNT replaces the defect position signals LJ and RJ with each other and outputs the replaced defect position signals LJ and RJ to the fuse decoder circuit FSDEC. When the value of the defect position signal RJ is larger than the value of the defect position signal LJ, the redundancy signal switch circuit RSWCNT outputs the defect position signals LJ and RJ to the fuse decoder circuit FSDEC without replacing them. A defect of one bit line pair BL and /BL is remedied by one of the redundant cell arrays RLARY and RRARY. Therefore, identical defect position information is not programmed in the redundancy program circuits LFUSE and RFUSE. The defect position signals LJ and RJ may be different from each other.

The fuse decoder circuit FSDEC outputs a shift signal to the redundancy switch circuit RSW in response to the defect position signals LJ and RJ. The redundancy switch circuit RSW couples the data lines of the input and output control circuit IOCNT to internal data lines in response to the shift signal from the fuse decoder circuit FSDEC. Based on the shift signal, an internal data line corresponding to the defective memory cell MC or bit line BL and /BL, for example, a defective internal data line, is not coupled to a data line of the input and output control circuit IOCNT.

Figure 2:
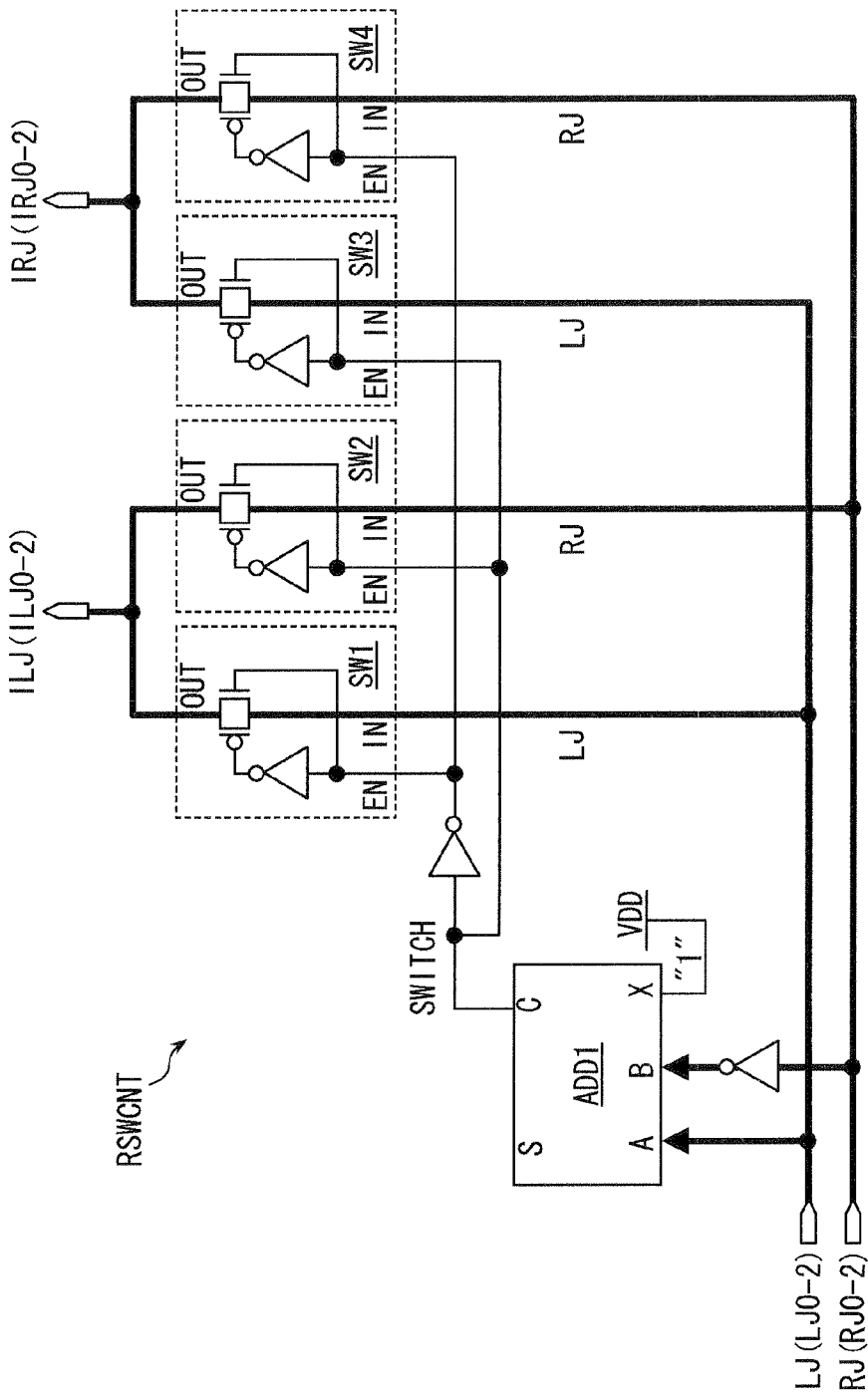
FIG. 2 illustrates an exemplary redundancy signal switch circuit.

FIG. 2 illustrates an exemplary redundancy signal switch circuit. The exemplary redundancy signal switch circuit may be the redundancy signal switch circuit RSWCNT illustrated in FIG. 1. The redundancy signal switch circuit RSWCNT includes an adder ADD1 and four switch circuits SW1 to SW4. The adder ADD1 receives a plurality of bits of the defect position signal LJ at one input A, while receiving a signal obtained by inverting the value of a plurality of bits of the defect position signal RJ at the other input B, thereby outputting a switch signal SWITCH from a carry output C. The defect position signal L is a three-bit signal LJ0 to LJ2, for example, while the defect position signal RJ is a three-bit signal RJ0 to RJ2, for example.

The adder ADD1 may include the same number of full adders, which are coupled in series, as bits of the defect position signals LJ and RJ, in accordance with some aspects. An input X of the adder ADD1 represents a carry input of the full adder of a first stage. The carry input of the full adder of the first stage may be set to "1", for example, VDD or may be set to "0". When the carry input of the full adder of the first stage is set to "0", an addition results in a value smaller by 1 than the result of addition illustrated in FIG. 3. The carry output C of the adder ADD1 represents a carry output of the full adder of a last stage. The inputs A and B of the adder ADD1 represent inputs of the full adder. When the value of the defect position signal RJ is smaller than the value of the defect position signal LJ, the adder ADD1 activates the switch signal SWITCH to a high level. When the adder ADD1 detects that a defective memory cell MC or defective bit line pair BL and /BL corresponding to the defect position information RJ, which is programmed in the redundancy program circuit RFUSE, is located between a defective memory cell MC or defective bit line pair BL and /BL corresponding to the defect position information LJ, which is programmed in the redundancy program circuit LFUSE, and the redundant cell array RLARY, the adder ADD1 activates the switch signal SWITCH.

The switches SW1 to SW4 include a CMOS transmission gate, which receives the switch signal SWITCH or the inverted signal of the switch signal SWITCH at an enable terminal EN. The switches SW1 and SW3 are turned ON when the switch signal SWITCH is deactivated to a low level and outputs the defect position signals LJ0 to LJ2 and RJ0 to RJ2 as internal defect position signals ILJ0 to ILJ2 and IRJ0 to IRJ2. The switches SW2 and SW4 are turned ON when the switch signal SWITCH is activated to a high level and outputs the defect position signals RJ0 to RJ2 and LJ0 to LJ2 as the defect position signals ILJ0 to ILJ2 and IRJ0 to IRJ2. When the value of the defect position signals RJ0 to RJ2 is smaller than the value of the defect position signals LJ0 to LJ2, the defect position signals RJ0 to RJ2 and LJ0 to LJ2 are replaced with each other.

Figure 3:
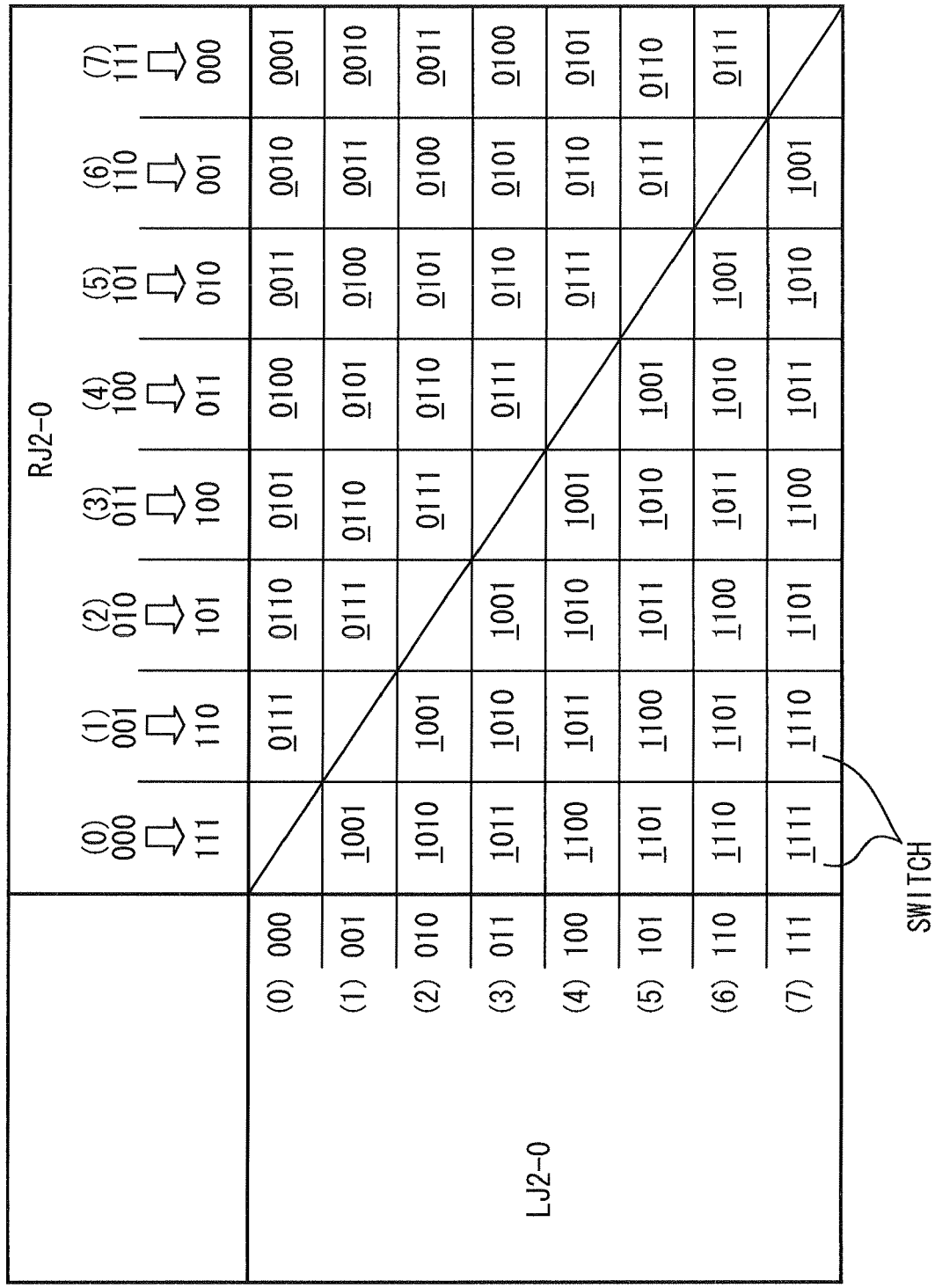
FIG. 3 illustrates an exemplary operation of a redundancy signal switch circuit.

FIG. 3 illustrates an exemplary operation of a redundancy signal switch circuit. The exemplary operation illustrated in FIG. 3 may be the operation of the redundancy signal switch circuit RSWCNT illustrated in FIG. 2. Numerical values 0 to 7 indicated in parentheses in the drawing are decimal numbers, while other numerals are binary numbers. The arrows in the drawing indicate that the defect position signals RJ are input to the adder ADD1 after being inverted. Four-digit binary numbers represent the result of addition in the adder ADD1. Underlined highest-order bits represent the carry bit C. The logic level of the switch signal SWITCH is substantially equal to the logic level of the highest-order bit of the four-digit binary number. The switch signal SWITCH is activated to a high level when the defect position signal RJ is smaller than the defect position signal LJ, and deactivated to a low level when the defect position signal RJ is larger than the defect position signal LJ. The switch signal SWITCH is activated when the memory cell MC or the bit line pair BL and /BL selected by the defect position signal RJ is located closer to the redundant cell array RLARY side than the memory cell MC or bit line pair BL and /BL selected by the defect position signal LJ.

Figure 4:
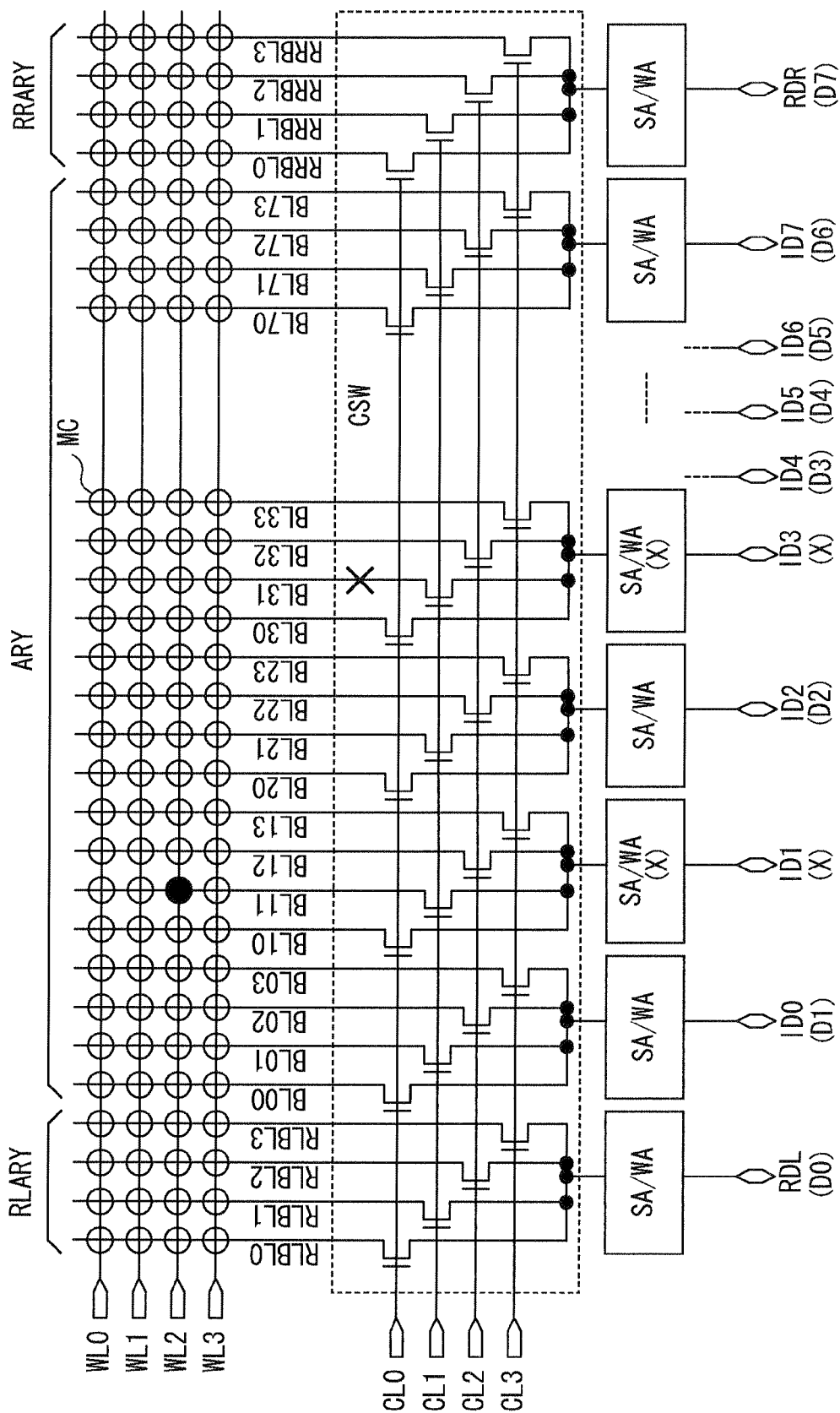
FIG. 4 illustrates an exemplary regular cell array, exemplary redundant cell arrays, and an exemplary column switch circuit.

FIG. 4 illustrates an exemplary regular cell array, exemplary redundant cell arrays, and an exemplary column switch circuit. The exemplary regular cell array, the exemplary redundant cell arrays, and the exemplary column switch circuit may be the regular cell array ARY, the redundant cell arrays RLARY and RRARY, and the column switch circuit CSW illustrated in FIG. 1. The regular cell array ARY includes four bit lines BL, for example, BL00, BL01, BL02, and BL03 corresponding to each of internal data lines ID0 to 7. The redundant cell array RLARY includes four redundant bit lines RLBL0 to RLBL3 corresponding to a redundant data line RDL. The redundant cell array RRARY includes four redundant bit lines RRBL0 to RRBL3 corresponding to a redundant data line RDR. The column switch circuit CSW couples the data lines RDL, ID0 to ID7, and RDR to one of the four bit lines in response to column selection signals CL0 to CL3. The bit line may be wired as a bit line pair. The data lines RDL, ID0 to ID7, and RDR may be wired as complementary signal lines. Instead of disposing the column switch circuit CSW, one bit line pair BL and /BL may be wired corresponding to the internal data lines ID0 to ID7.

For example, the memory cell MC indicated by the black circle in the drawing includes a defect, and a bit line BL31 indicated by the mark X in the drawing includes a defect. The defects are detected by a test system, for example. The defect of the memory cell MC may be regarded as the defect of a bit line BL11. The defect of the bit line BL31 may be regarded as the defect of the memory cell MC coupled to the bit line BL31.

The internal data lines ID1 and ID3, the sense amplifier SA, and the write amplifier WA, which correspond to the defective memory cell. MC and the defective bit line BL31, are not used (indicated by the mark X in the drawing). For example, the redundancy switch circuit couples a data line D0 to the redundant data line RDL, a data line D1 to the internal data line ID0, and a data line D2 to the internal data line ID2. The redundancy switch circuit may be the redundancy switch circuit RSW illustrated in FIG. 5, for example. Data lines D3 to D6 are sequentially coupled to the internal data lines ID4 to ID7, and a data line D7 is coupled to the redundant data line RDR. The data lines D0 to D7 are coupled to the redundant data line RDL, the internal data line ID0, the internal data line ID2, the internal data line ID4 to 7, and the redundant data line RDR, while avoiding the position of the defects.

Figure 5:
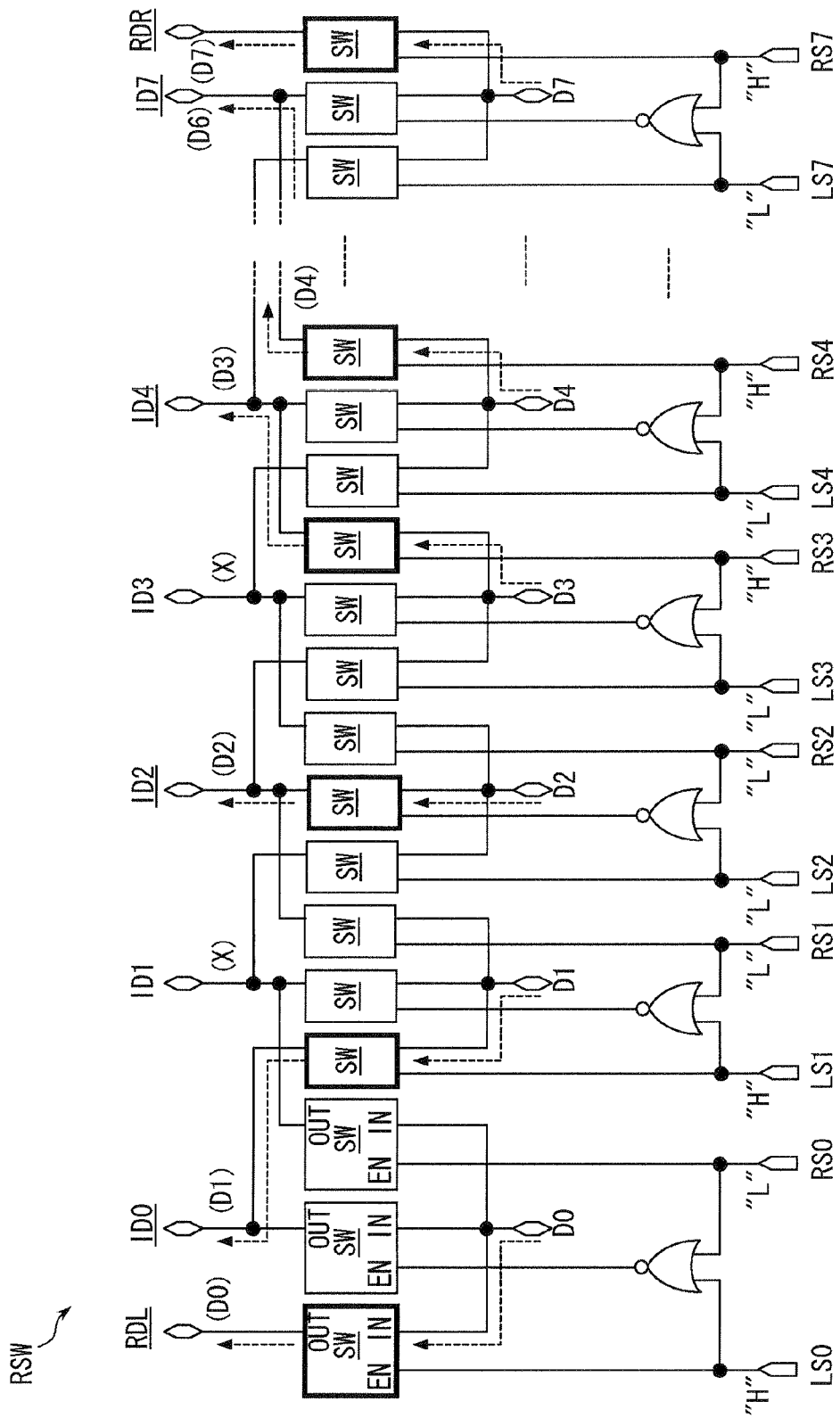
FIG. 5 illustrates an exemplary redundancy switch circuit.

FIG. 5 illustrates an exemplary redundancy switch circuit RSW. The exemplary redundancy switch circuit may be the redundancy switch circuit RSW illustrated in FIG. 1. The redundancy switch circuit RSW includes a plurality of switch circuits SW. The plurality of switch circuits SW couple each of the data lines D0 to D7 to three adjacent lines among the internal data lines ID0 to ID7 and redundant data lines RDL and RDR. The configuration of the switch circuit SW is substantially the same as or similar to that of the switch circuits SW1 to 4 illustrated in FIG. 2.

For example, the data line D0 is coupled to one of the redundant data line RDL, the internal data line ID0, and the internal data line ID1 in response to selection signals LS0 and RS0 from the fuse decoder circuit FSDEC. The data line D1 is coupled to one of the internal data line ID0, the internal data line ID1, and the internal data line ID2 in response to the selection signals LS1 and RS1. Each of the data lines D2 to 6 is coupled to one of three adjacent internal data lines, for example, ID1 to 3, in response to the corresponding selection signals LS2 to LS6 and RS2 to RS6. The data line D7 is coupled to one of the internal data line ID6, the internal data line ID7, and the redundant data line RDR, in response to the selection signals LS7 and RS7.

In FIG. 5, the selection signals LS0 and 1, and RS3 to 7 are set to a high level, similar to FIG. 4, while the selection signals LS2 to LS7, and RS0 to RS2 are set to a low level. The switch circuits SW indicated by the bold frames in the drawing are turned ON. As indicated by the broken arrows, the data lines D0 to D7 are respectively coupled to the redundant data line RDL, the internal data line ID0, the internal data line ID2, the internal data lines ID4 to ID7, and the redundant data line RDL.

When the defect position signals RJ0 to RJ2 are smaller than the defect position signals LJ0 to LJ2, the defect position signals LJ0 to LJ2 and RJ0 to RJ2 are replaced with each other by the redundancy signal switch circuit RSWCNT. In the redundancy switch circuit RSW, the switching paths of the data lines D0 to D7 do not cross one another. The selection signal LS and selection signal RS having the same final number are not contemporaneously set to a high level. For example, two switch circuits SW coupled to each of the data lines D1 to D3 are not contemporaneously turned ON to thereby avoid the collision of data.

Figure 6:
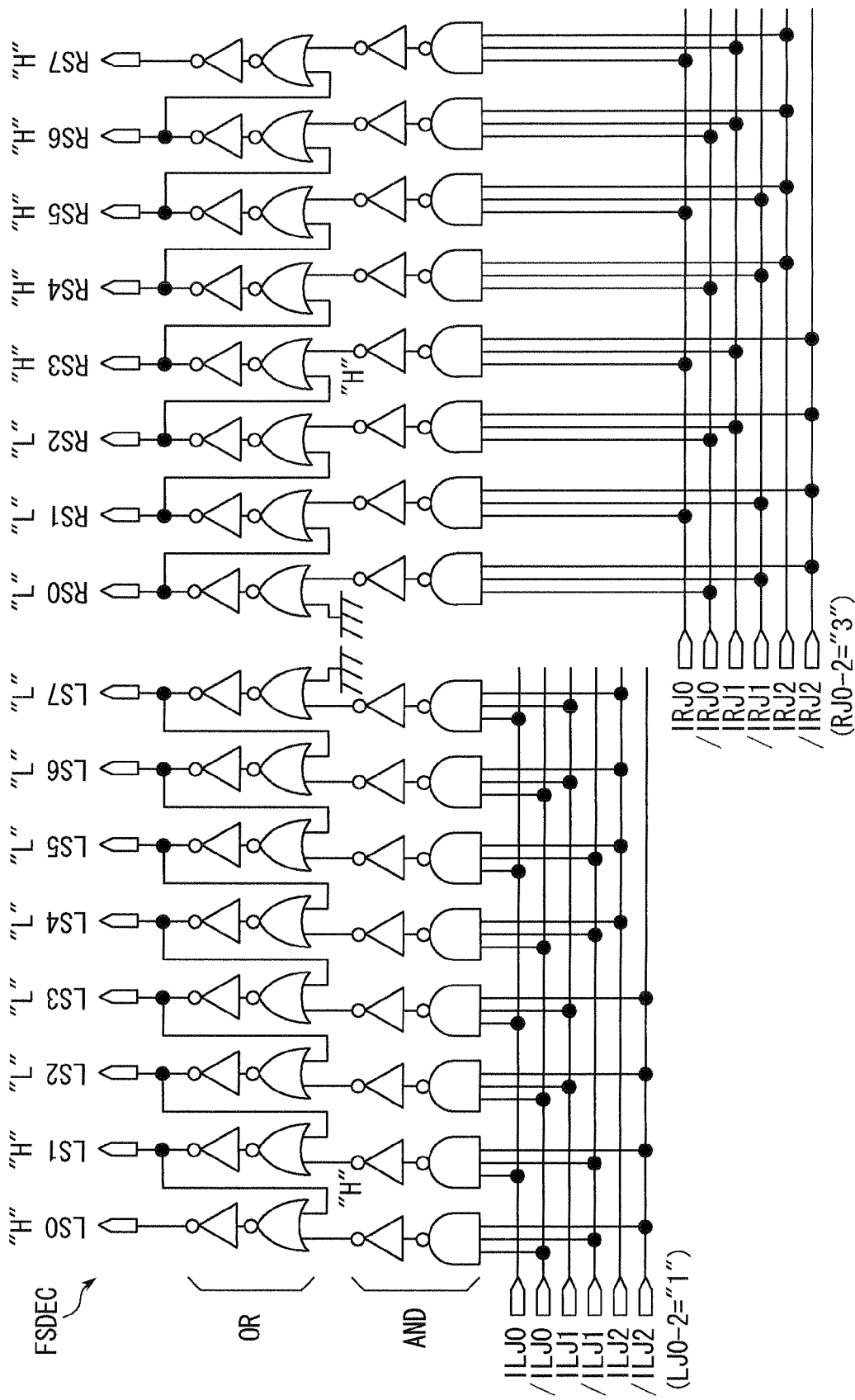
FIG. 6 illustrates an exemplary fuse decoder circuit.

FIG. 6 illustrates an exemplary fuse decoder circuit. The exemplary fuse decoder circuit may be the fuse decoder circuit FSDEC illustrated in FIG. 1. The fuse decoder circuit FSDEC includes AND circuits which decode the defect position signal LJ, AND circuits which decode the defect position signal RJ, and OR circuits which generate the selection signals LS0 to LS7 and RS0 to RS7, in accordance with the output of the AND circuits, and are coupled in series. The defect position signals ILJ0 to ILJ2 and IRJ0 to IRJ2 are inverted by a CMOS inverter or the like, whereby defect position signals /ILJ0 to /ILJ2 and /IRJ0 to /IRJ2 to be supplied to the AND circuits are generated.

For example, when the value of the defect position signals LJ0 to LJ2 is "1", the second AND circuit from the left in FIG. 6 among the AND circuits corresponding to the selection signals LS0 to LS7 outputs a high level signal. The selection signals LS0 and LS1 are set to a high level, while the selection signals LS2 to LS7 are set to a low level. For example, when the defect position signals RJ0 to RJ2 are "3", the fourth AND circuit from the left in FIG. 6 among the AND circuits corresponding to the selection signals RS0 to RS7 outputs a high level signal. The selection signals RS3 to RS7 are set to a high level, while the selection signals RS0 to RS2 are set to a low level.

For example, when the defect position signals LJ0 to LJ2 are each "3", and the defect position signals RJ0 to RJ2 are each "1", the switch signal SWITCH is activated to a high level. Therefore, the defect position signals LJ0 to LJ2 and RJ0 to RJ2 are replaced with each other by the redundancy signal switch circuit RSWCNT. The selection signals IJS0 to LJS1 are set to a high level corresponding to the defect position signals RJ0 to RJ2. The selection signals RS3 to RS7 are set to a high level corresponding to the defect position signals LJ0 to LJ2.

Figure 7:
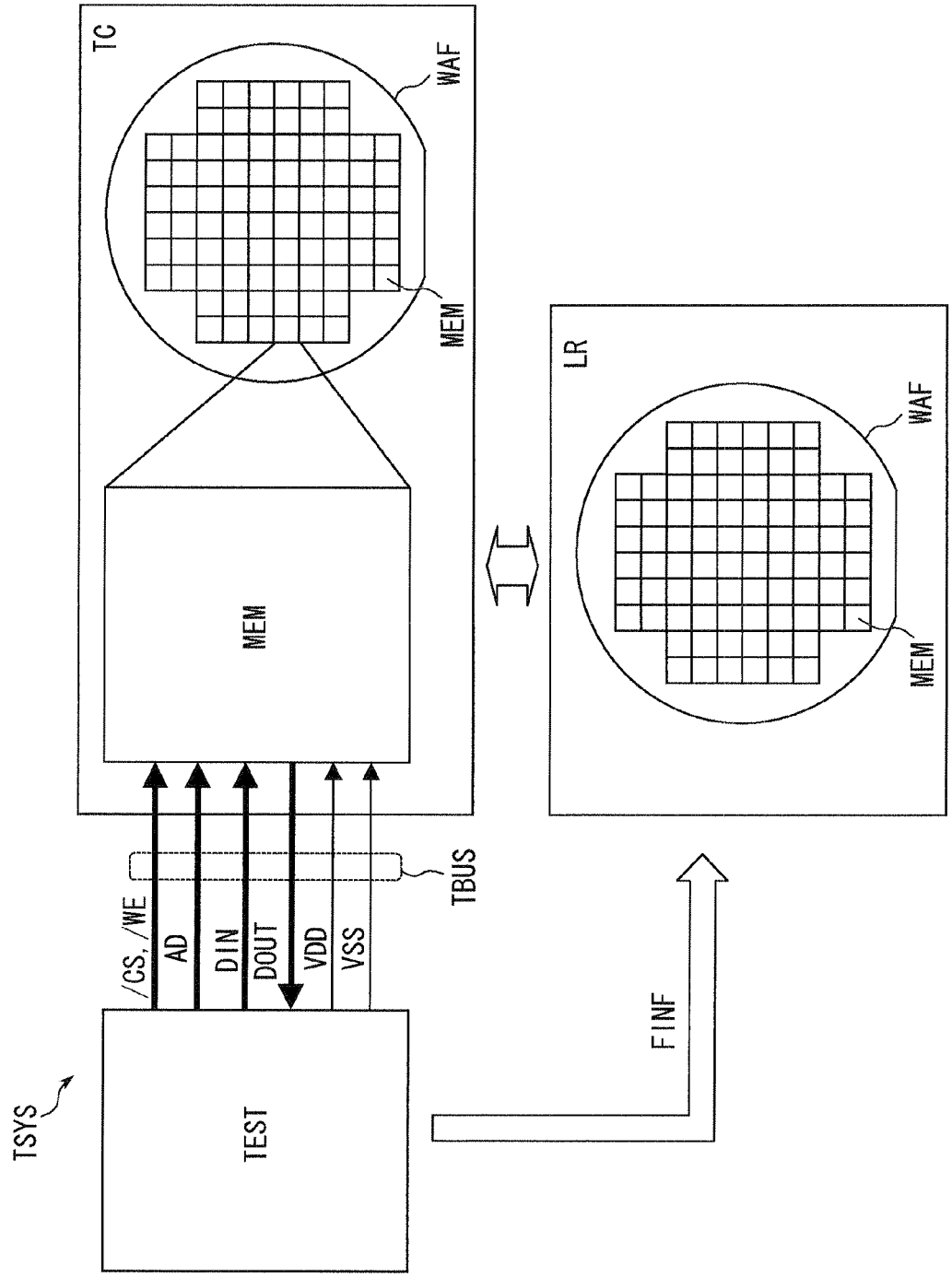
FIG. 7 illustrates an exemplary test system.

FIG. 7 illustrates an exemplary test system for testing a memory. The exemplary test system TSYS may test the memory MEM illustrated in FIG. 1. The test system TSYS includes a constant temperature bath TC, where a high temperature test and a low temperature test are carried out, and a laser processing apparatus LR. The laser processing apparatus LR programs the redundancy program circuits LFUSE and RFUSE illustrated in FIG. 1, for example. When the fuse of the redundancy program circuits LFUSE and RFUSE is an electric fuse, the laser processing apparatus LR may not be disposed.

In the manufacturing process of a memory, a plurality of the memories MEM are formed on a semiconductor wafer WAF by a semiconductor manufacturing process. For example, before the memory MEM is cut from the wafer WAF, the memory MEM is tested by an LSI tester TEST in a test process. The memory MEM housed in the constant temperature bath TC is coupled to the LSI tester TEST via a test bus TBUS, for example. For example, a plurality of memories, such as 4, 16 or 64-bit memories, may be coupled to the LSI tester TEST.

The LSI tester TEST supplies the chip select signal /CS, the write enable signal /WE, the address signal AD, and the write data signal DIN to the memory MEM, and receives a read data signal DOUT from the memory MEM based on a test program. In the test process, the test for the memory MEM is performed. When the laser fuse of the redundancy program circuits LFUSE and RFUSE is programmed, the wafer WAF is moved from the constant temperature bath TC to the laser processing apparatus LR. Defect position information FINF obtained by the test is transmitted from the LSI tester TEST to the laser processing apparatus LR.

Figure 8:
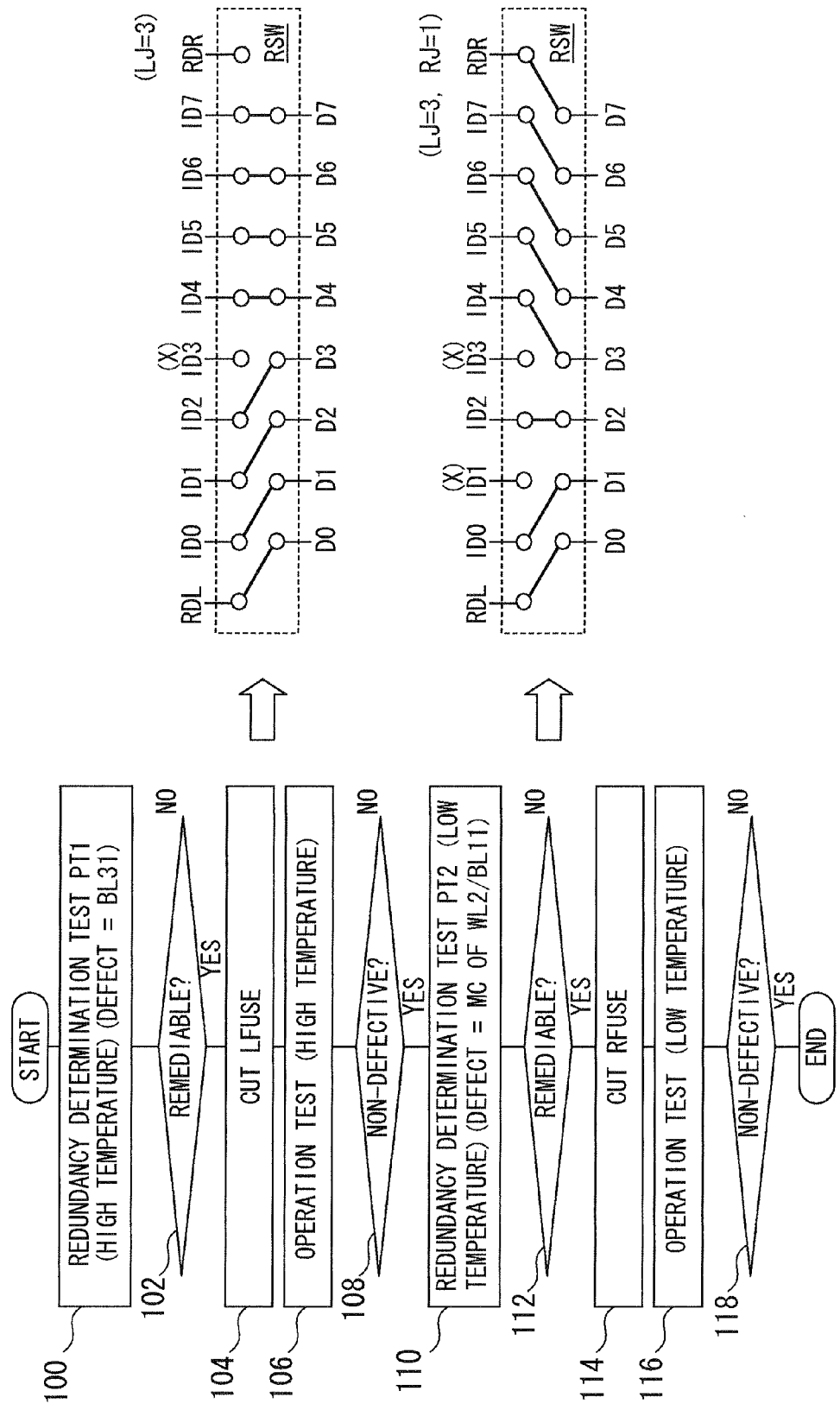
FIG. 8 illustrates an exemplary test for a memory.

FIG. 8 illustrates an exemplary test for a memory. The test flow may be performed by the test system TSYS illustrated in FIG. 7. For example, the memory MEM is tested at a high temperature and thereafter tested at a low temperature. Margin defect having a temperature dependency is detected and remedied by the tests at the two temperatures. The reliability of the memory MEM is improved. For example, the memory chip MEM on the wafer WAF is tested in accordance with processes in the flow diagram illustrated in FIG. 8. The test at a high temperature may be carried out after the test at a low temperature is carried out.

In process 100, a redundancy determination test PT1, for example, a high temperature test, is carried out by using the LSI tester TEST and the constant temperature bath TC. The LSI tester TEST detects the defect of the bit line BL31 (the mark X illustrated in FIG. 4). In process 102, the LSI tester TEST determines whether or not the defect is remedied. The LSI tester TEST may determine that the defect is remedied because one bit line is defective. The memory chip MEM, which is determined as unremediable, is determined as defective, and subsequent processes may not be performed on the memory chip MEM.

In process 104, the laser processing apparatus LR programs, for example, cuts the redundancy program circuit LFUSE in order to remedy the defect of the bit line BL31. The defect position signals LJ0 to LJ2 are each set to, for example, "3" by the program. When the redundancy program circuit LFUSE includes an electric fuse, the redundancy program circuit LFUSE is programmed by the LSI tester TEST.

The redundancy switch circuit RSW cuts off the internal data line ID3 and sequentially couples the data lines D3 to D0 to the internal data lines D2 to D0 and the redundant data line RDL by the program. In process 106, in order to confirm that the defect of the bit line BL31 has been properly remedied, an operation test is carried out by using the LSI tester TEST and the constant temperature bath TC. When the memory MEM is mounted on another function block, for example, a system LSI including IP or the like, the function block may be tested in the operation test.

In process 108, the LSI tester TEST determines whether or not the memory MEM is non-defective, based on the operation test. Process 110 and subsequent processes are carried out with respect to a non-defective memory MEM. In process 110, a redundancy determination test PT2, for example, a low temperature test, is carried out by using the LSI tester TEST and the constant temperature bath TC. The ISI tester TEST detects the defect of the memory cell MC, which is coupled to the word line WL2 and the bit line BL11, for example, the memory cell corresponding to the black circle illustrated in FIG. 4. In process 112, the LSI tester TEST determines whether or not the defect is remedied. The LSI tester TEST determines that the defect is remedied because one memory cell MC is defective.

In process 114, the laser processing apparatus LR programs, for example, cuts the redundancy program circuit RFUSE in order to remedy the defect of the memory cell MC. The defect position signals RJ0 to 2 are set to "1", by the program. When the redundancy program circuit RFUSE includes an electric fuse, the redundancy program circuit RFUSE is programmed by using the LSI tester TEST. Since the defect position signals RJ0 to RJ2, for example, "1" are smaller than the defect position signals LJ0 to LJ2, for example, "3", the defect position signals LJ0 to LJ2 and RJ0 to RJ2 are replaced with each other. The redundancy switch circuit RSW cuts off the internal data lines ID1 and ID3, sequentially couples the data lines D1 and D0 to the internal data line D0 and the redundant data line RDL, and sequentially couples the data lines D3 to D7 to the internal data lines ID4 to ID7 and the redundant data line RDR.

In process 116, an operation test is carried out by using the LSI tester TEST and the constant temperature bath TC, in order to confirm that the defect of the memory cell MC has been remedied. When the memory MEM is mounted on another function block, for example, a system LSI including IP or the like, the function block may be tested in the operation test. In process 118, the LSI tester TEST determines whether or not the memory MEM is non-defective based on the operation test. A non-defective memory MEM is processed in the next packaging process, for example.

Figure 9:
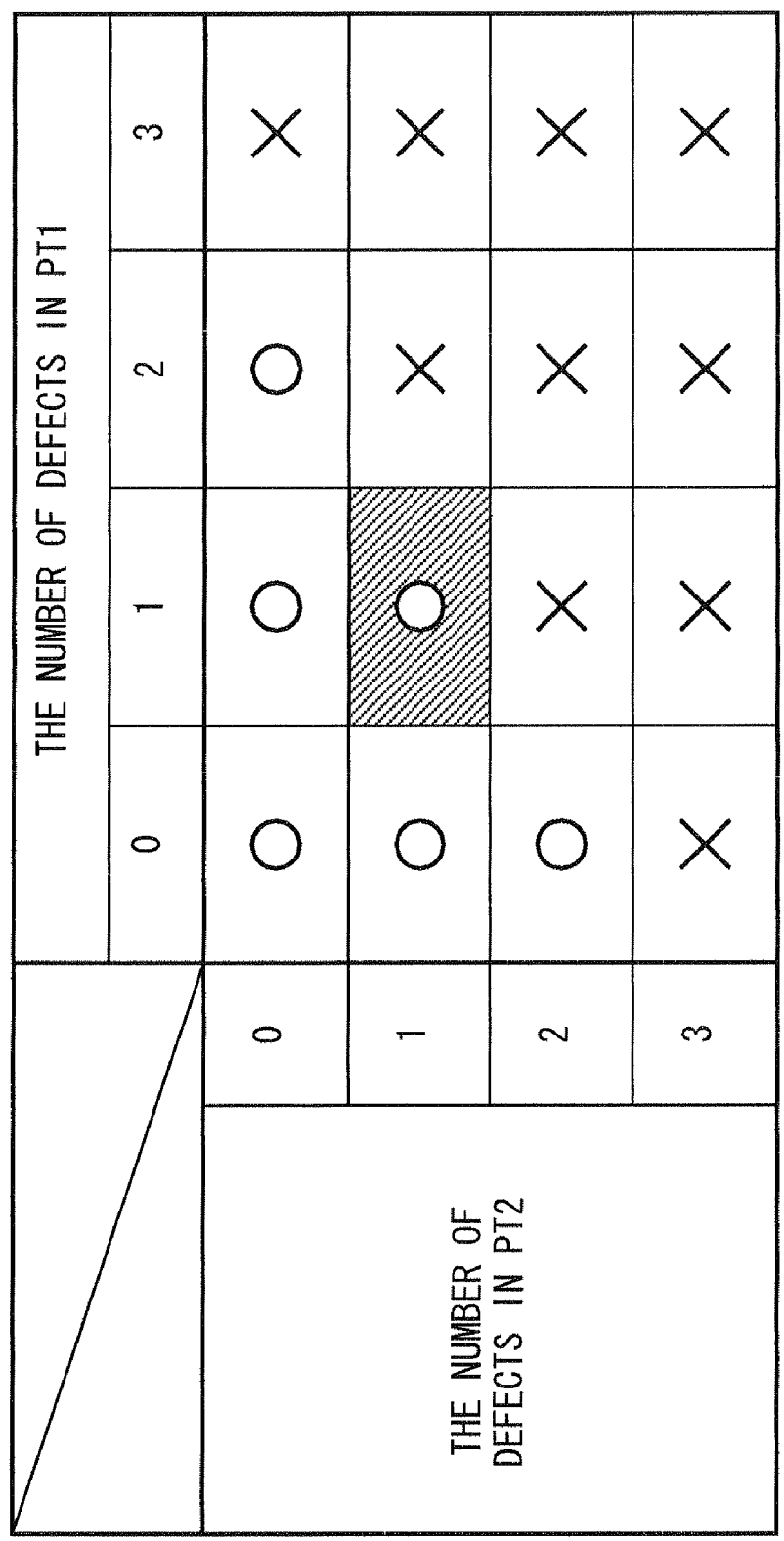
FIG. 9 illustrates an exemplary number of remediable defects of a memory.

FIG. 9 illustrates an exemplary number of remediable defects of a memory. The exemplary number of remediable defects represents the number of remediable defects of, for example, the memory MEM illustrated in FIG. 1. The circles in FIG. 9 indicate that the defect(s) is (are) remedied. The marks X in FIG. 9 indicate that the defects are not remedied. For example, two defects are remedied in the memory MEM illustrated in FIG. 1. When the number of defects detected by the redundancy determination test PT1 and the redundancy determination test PT2 is two, the defect of the memory MEM is remedied.

As indicated by the hatched lines in FIG. 9, even when one defect is detected in each of the redundancy determination test PT1 and the redundancy determination test PT2, and the defect position signals RJ0 to RJ2 are smaller than the defect position signals LJ0 to 2, the defects are remedied. Irrespective of the defect position signals LJ0 to LJ2 and RJ0 to RJ2, the defects are remedied.

In accordance with the position of defects indicated by the defect position information LJ0 to LJ2 and RJ0 to RJ2, the defect position information LJ0 to LJ2 and RJ0 to RJ2 are replaced with each other Irrespective of the position of defects and the order of remedy, the defective memory cell MC or the defective bit line pair BL and /BL is remedied by using the redundant cell arrays RLARY and RRARY. Irrespective of the position of defects detected by the redundancy determination tests PT1 and PT2, the defects are effectively remedied by using redundant circuits such as the redundant cell arrays RLARY and RRARY, thereby improving the yield of the memory MEM.

The adder ADD1 automatically detects the positional relationship of defects indicated by the defect position information LJ0 to LJ2 and RJ0 to RJ2, and the switch signal SWITCH is activated. By the program of the LSI tester TEST or the like, the positional relationship of defects indicated by the defect position information LJ0 to LJ2 and RJ0 to RJ2 may not be compared. The position of defect detected by the redundancy determination test PT1 may not be retained for the redundancy determination test PT2. Since defect information is not exchanged between the redundancy determination test PT1 and the redundancy determination test PT2, the test program may be easily designed. Irrespective of the position of defect detected by the operation test, the defect is effectively remedied by using a redundant circuit.

Figure 10:
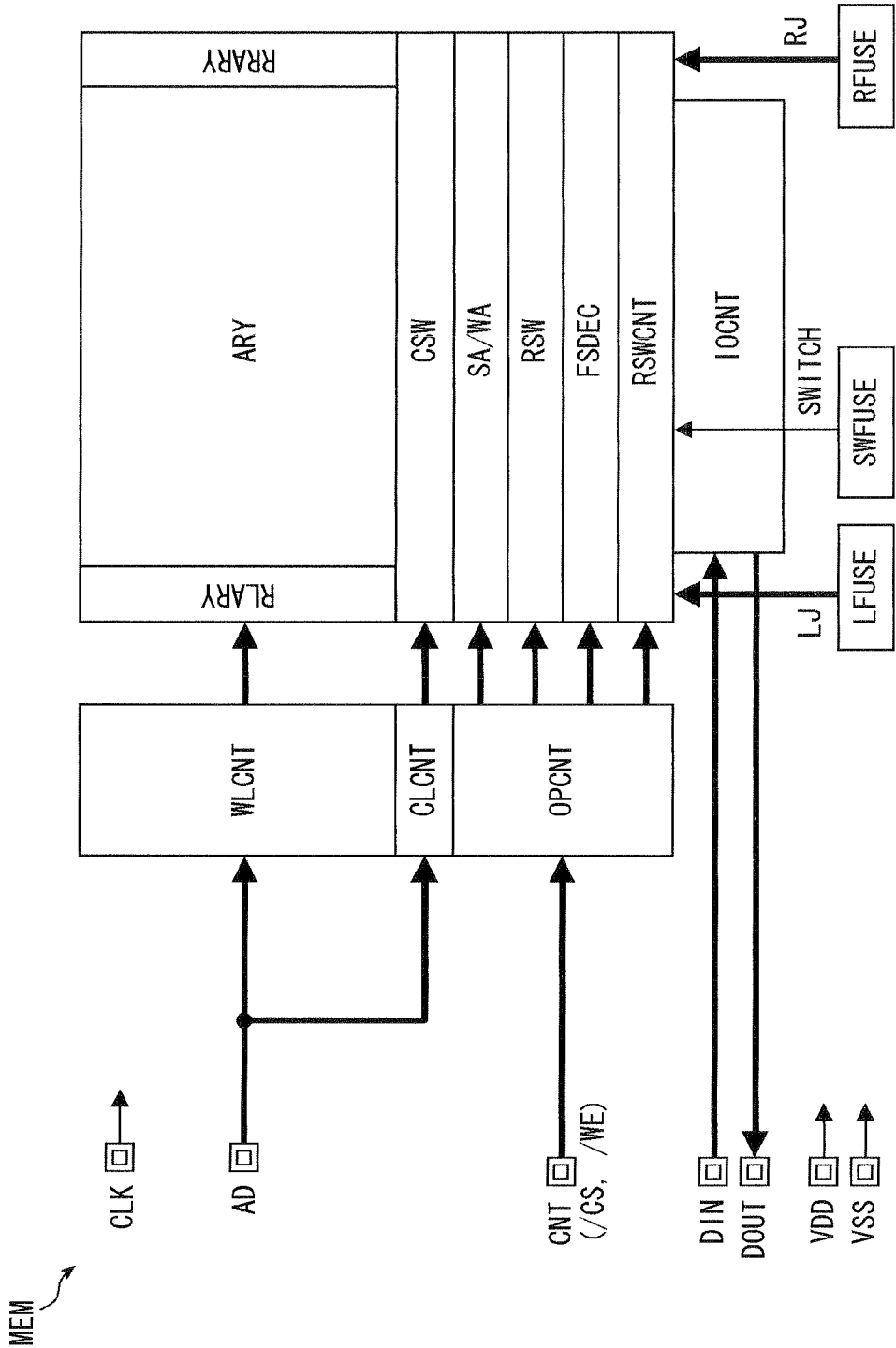
FIG. 10 illustrates various exemplary features in accordance with a second variation.

FIG. 10 illustrates various exemplary features in accordance with a second variation. The same reference numerals and signs are assigned to substantially similar elements as those in the first illustrated variation, and the description thereof is omitted or shortened. The memory MEM includes a switch program circuit SWFUSE. A redundancy signal switch circuit RSWCNT of the memory MEM is different from the redundancy signal switch circuit RSWCNT of the first variation. Other configurations are substantially the same as or similar to those illustrated in FIG. 1. The memory MEM may be an SRAM.

The switch program circuit SWFUSE includes a fuse that is programmed when the defect position signal RJ is smaller than the defect position signal LJ. The switch program circuit SWFUSE outputs the switch signal SWITCH at a high level when it is programmed.

Figure 11:
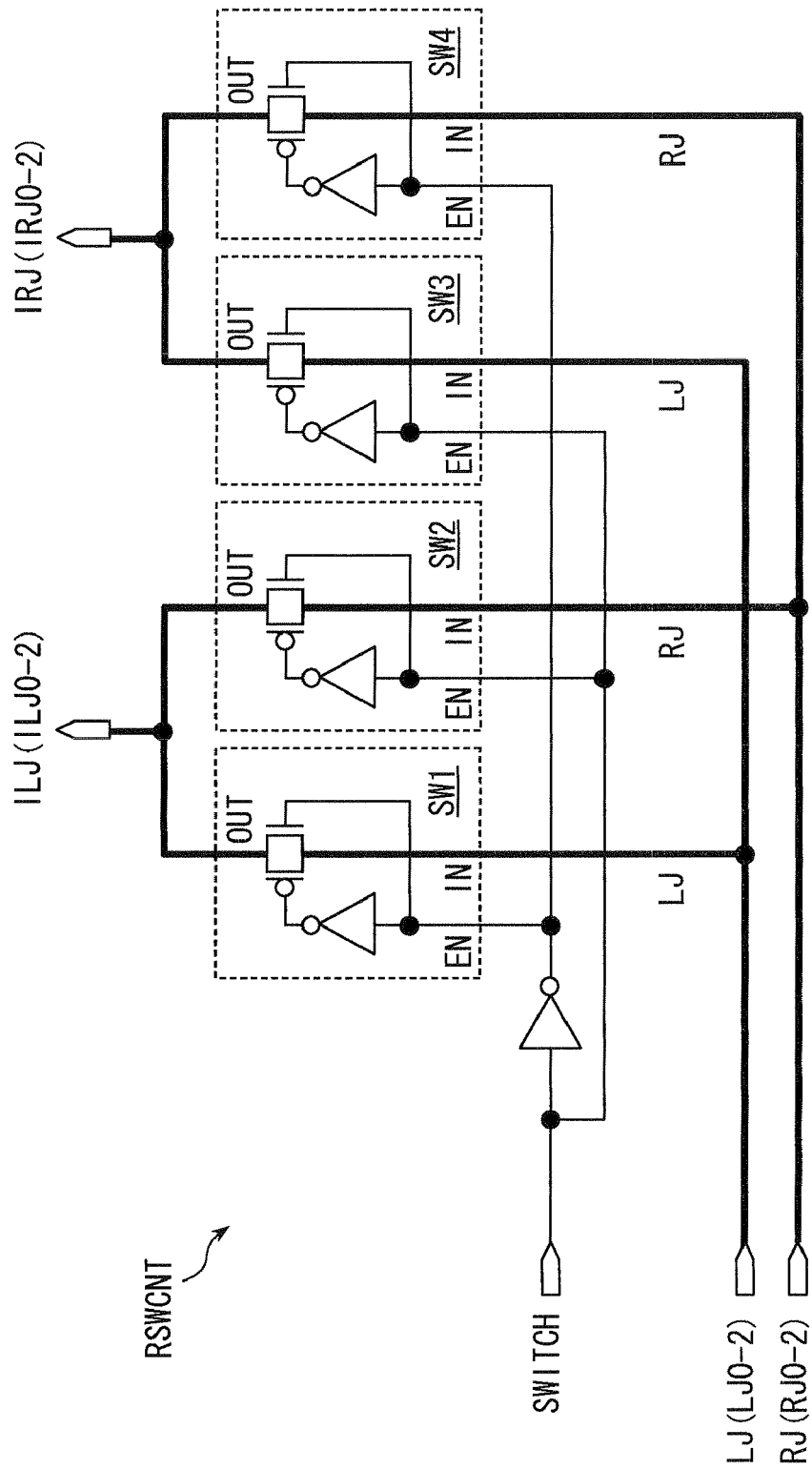
FIG. 11 illustrates an exemplary redundancy signal switch circuit.

FIG. 11 illustrates an exemplary redundancy signal switch circuit. The exemplary redundancy signal switch circuit may be the redundancy signal switch circuit RSWCNT illustrated in FIG. 10. The redundancy signal switch circuit illustrated in FIG. 11 does not include the adder ADD1 of the redundancy signal switch circuit RSWCNT illustrated in FIG. 2. The switch signal SWITCH is supplied from the outside of the signal switch control circuit RSWCNT. Other configurations are substantially the same as or similar to those illustrated in FIG. 2.

For example, in the second variation, a program process of the switch program circuit SWFUSE may be added to process 114 illustrated in FIG. 8. In process 114, when the defect position signal RJ is smaller than the defect position signal LJ, the switch program circuit SWFUSE is programmed. Other processes in the test flow are substantially the same as or similar to those in FIG. 8. A test system T may be substantially the same as the test system SYS illustrated in FIG. 7.

The second variation provides a substantially similar effect to that in the first variation. For example, the adder ADD1, which compares the positional relationship of defects indicated by the defect position information LJ and RJ, may not be disposed. A defect of the memory MEM having a reduced circuit size is remedied by using redundant circuits, such as the redundant cell arrays RLARY and RRARY.

Figure 12:
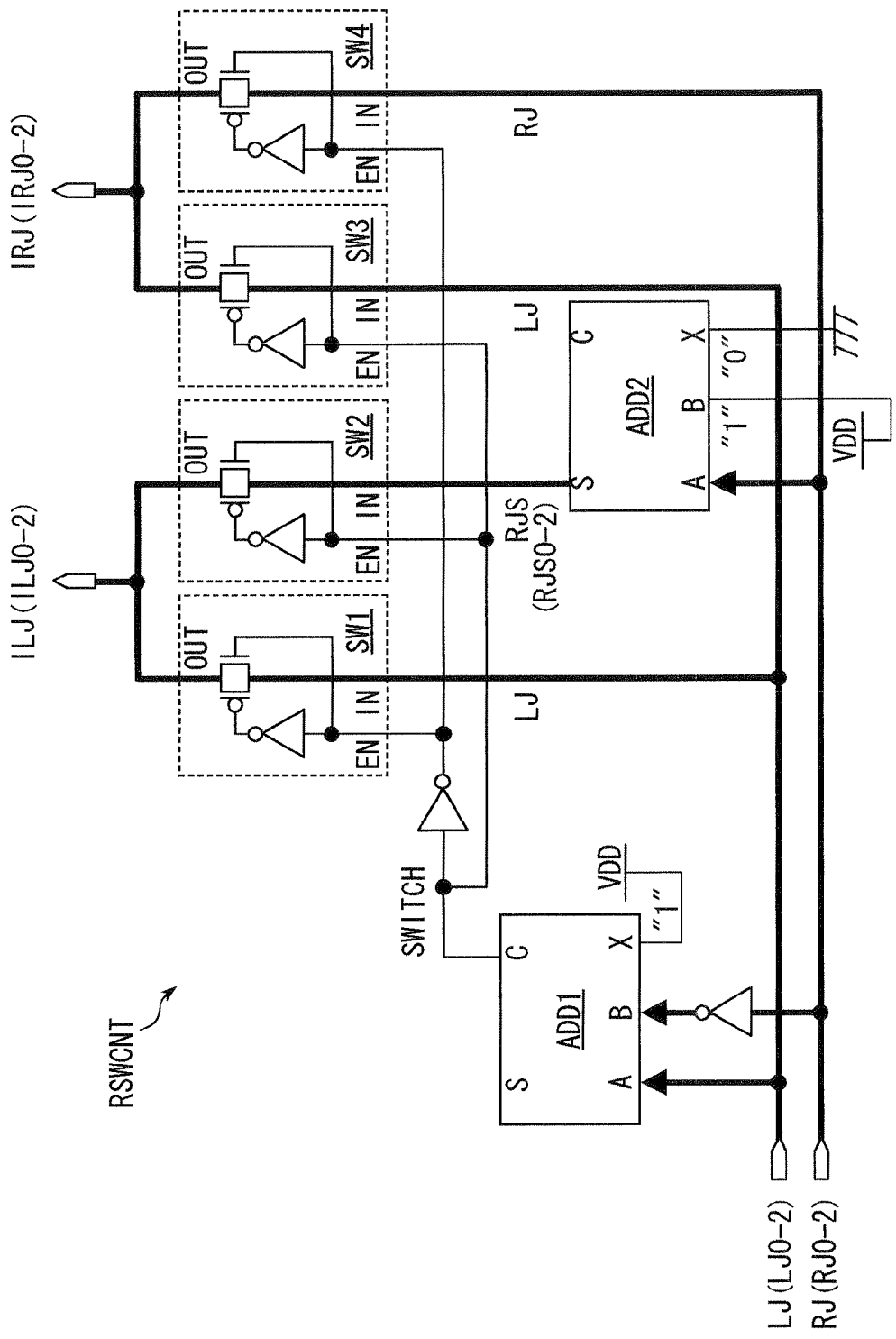
FIG. 12 illustrates various exemplary features in accordance with a third variation.

FIG. 12 illustrates a third variation. FIG. 12 illustrates an exemplary redundancy signal switch circuit. The same reference numerals and signs are assigned to elements similar to those in the previous variations, and the detailed description thereof is omitted or reduced. Configurations other than the redundancy signal switch circuit RSWCNT are substantially the same as or similar to those illustrated in FIGS. 1, 4, 5, and 6. The semiconductor memory MEM may be an SRAM.

The switch circuit SW2 receives defect position signals RJS0 to RJS2 instead of the defect position signals RJ0 to RJ2, via an adder ADD2. The adder ADD2 outputs signals obtained by subtracting 1 from the defect position signals RJ0 to RJ2 has the defect position signals RJS0 to RJS2. For example, the adder ADD2 includes the same number of full adders, which are coupled in series, as bits of the defect position signals LJ and RJ. An input A of the adder ADD2 may be an input of the full adder. Inputs B and X of the adder ADD2 may be inputs of the full adder of the first stage. The inputs B of the full adders other than that of the first stage may be coupled to a ground wire VSS, for example, a ground. An output S of the adder ADD2 may be an output of the full adder.

In FIG. 8, for example, a defect of the memory cell MC or the bit line pair BL and /BL corresponding to the internal data line ID3 is detected in the redundancy determination test PT1. A defect of the memory cell MC or the bit line pair BL and /BL, corresponding to the internal data line ID1, is detected in the redundancy determination test PT2. The defective memory cell MC indicated by the defect position information RJ is located between the defective bit line BL31 indicated by the defect position information LJ and the redundant cell array RLARY.

In process 104 in FIG. 8, after the redundancy program circuit LFUSE is programmed, for example, the data line D2 is coupled to the internal data line ID1. When the LSI tester TEST accesses the memory cell MC corresponding to the data line D2, the memory cell MC corresponding to the internal data line ID1 is accessed.

In FIG. 8, when the memory cell MC, corresponding to the internal data line ID1, is accessed in the tests following the process 104, data may be input and output via the data line D2. The test program of the LSI tester TEST may consider the input and output of the data. In the redundancy determination test PT2, when a defect of the memory cell MC or the bit line pair BL and /BL corresponding to the data line D2 is detected, a value corresponding to the internal data line ID1 is programmed into the redundancy program circuit RFUSE in process 114. The defect position information is exchanged.

The adder ADD2 subtracts 1 from the defect position signal RJ. When a defect of the memory cell MC corresponding to the data line D2, for example, the internal data line ID1, is detected, a value corresponding to the data line D2 is programmed into the redundancy program circuit RFUSE, whereby the defect of the memory cell MC corresponding to the internal data line ID1 is remedied. The adder ADD2 changes the defect position information RJ which is output from the redundancy program circuit RFUSE to the defect position information RJS, indicative of the position, which is shifted by one to the redundant cell array RLARY side.

For example, when the defect position signal RJ is larger than the defect position signal LJ, the numbers of the data line D5 and the internal data line ID5 coincide with each other. The value of the defect position signal RJ, which is supplied via the switch SW4 illustrated in FIG. 12, may not be operated. In the process 104 in FIG. 8, since the LSI tester TEST may not change the defect position information irrespective of whether or not the redundancy program circuit LFUSE is programmed, the test program is easily designed.

The third variation provides a similar effect to those in the previous variations. Irrespective of the defect position signal RJ, which is programmed after the redundancy determination test PT2, a data line accessed by the LSI tester TEST and a data line indicated by the defect position signal RJ, which is programmed into the redundancy program circuit RFUSE, coincide with each other. As a result, the test program may be easily designed. Irrespective of the position of defect detected in the redundancy determination test PT2, the defect is effectively remedied using a redundant circuit.

Figure 13:
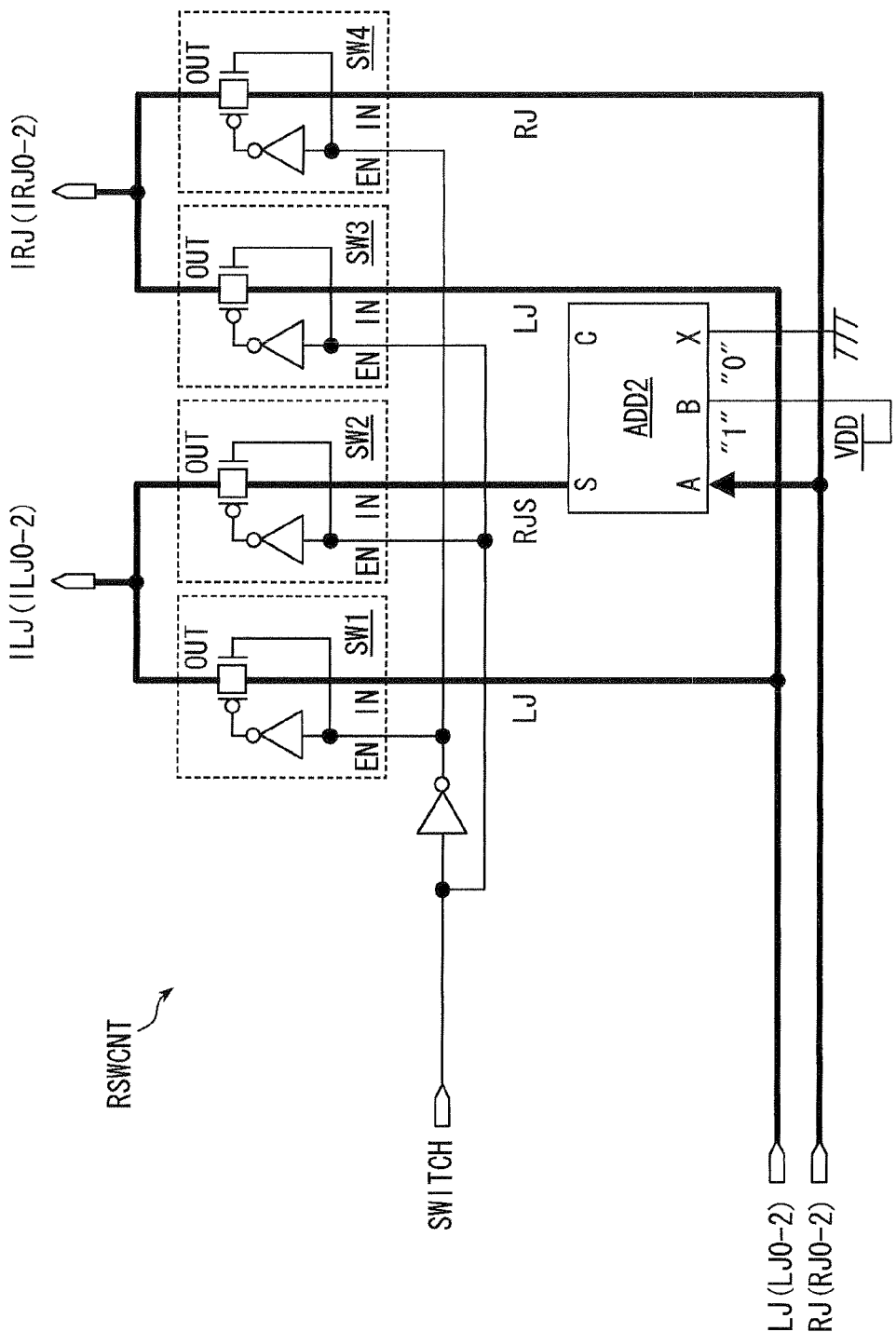
FIG. 13 illustrates various exemplary features in accordance with a fourth variation.

FIG. 13 illustrates a fourth variation containing an exemplary redundancy signal switch circuit. The same reference numerals and signs are assigned to elements similar to those in the previous variations, and the detailed description thereof is omitted or shortened. Configurations other than the redundancy signal switch circuit RSWCNT are substantially the same as or similar to those illustrated in FIG. 10. The semiconductor memory MEM may be an SRAM. The redundancy signal switch circuit RSWCNT may not include the adder ADD1. The switch signal SWITCH is supplied from outside of the signal switch control circuit RSWCNT. Other configurations are substantially the same as or similar to those illustrated in FIG. 12.

In the fourth variation, for example, the program process of the switch program circuit SWFUSE is added to the process 114 illustrated in FIG. 8. In the process 114, when the defect position signal RJ is smaller than the defect position signal LJ, the switch program circuit SWFUSE is programmed. Other processes in the test flow are substantially the same as or similar to those in the test flow illustrated in FIG. 8. A test system for testing the memory MEM may be substantially the same as the test system TSYS illustrated in FIG. 7. The fourth variation provides a substantially similar effect to those in the previous variations.

Figure 14:
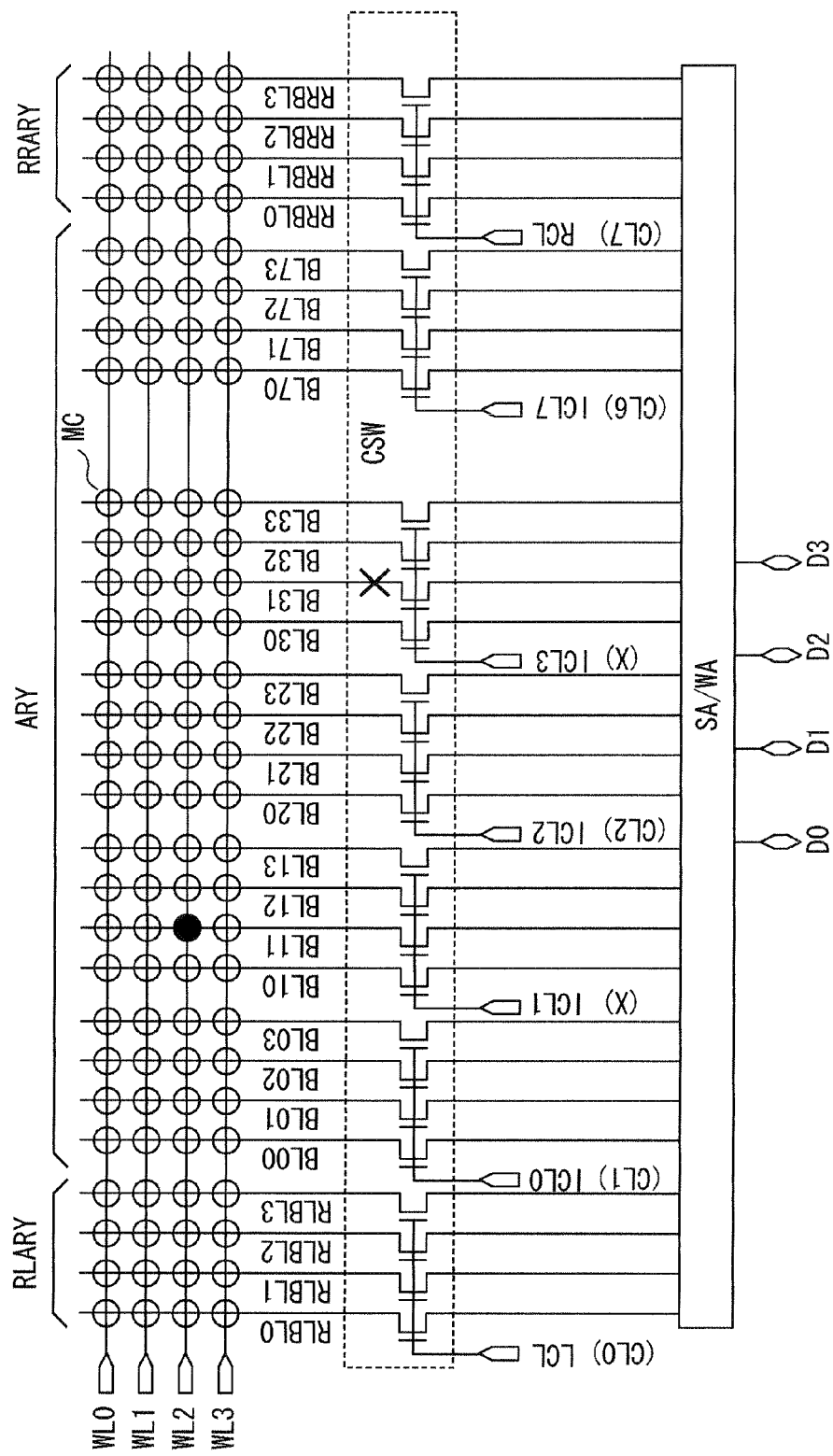
FIG. 14 illustrates various exemplary features in accordance with a fifth variation.

FIG. 14 illustrates a fifth variation containing exemplary cell arrays and an exemplary column switch. The same reference numerals and signs are assigned to elements similar to those in the previous variation, and the description thereof is omitted or shortened. Configurations other than the cell arrays ARY, RLARY, and RRARY, and the column switch CSW are substantially the same as or similar to those illustrated in FIGS. 1, 2, and 6. The semiconductor memory MEM may be an SRAM. A test system may be substantially the same as the test system TSYS illustrated in FIG. 7. The redundancy switch circuit RSW switches the column selection lines CL0 to 7. Other configurations are substantially the same as or similar to those in FIG. 8. The column switch CSW includes regular column switches coupled to the column selection lines CL0 to CL7 and redundant column switches coupled to redundant column selection lines LCL and RCL.

The position of a column switch to be turned ON is shifted by shift redundancy. The column switch CSW to be turned ON is switched by an internal column selection signal ICL, for example, regular column selection signals ICL0 to ICL7 and the redundant column selection signals LCL and RCL. For example, the memory cell MC indicated by the black circle in FIG. 4 includes a defect, and the bit line BL31 indicated by the mark X in FIG. 4 includes a defect.

The defect of the bit line BL31 may be detected in the redundancy determination test PT1 illustrated in FIG. 8, for example. In process 104, a value indicative of the column selection signal ICL3 corresponding to the defect is programmed into the redundancy program circuit LFUSE as the defect position information LJ. The defect of the memory cell MC indicated by the black circle may be detected in the redundancy determination test PT2 illustrated in FIG. 8, for example. In the process 114, a value indicative of the column selection signal ICL1 corresponding to the defect is programmed into the redundancy program circuit RFUSE as the defect position information RJ.

For example, when the memory cell MC is defective, the defect position signals LJ and RJ indicate the position of a bit line pair BL and /BL, which is coupled to the defective memory cell MC, or the position of a column switch, which is coupled to the bit line pair BL and /BL. The defect of the memory cell MC may be regarded as the defect of the bit line pair BL and /BL or the defect of the column switch. The defect of the bit line pair BL and /BL or the defect of the column switch may be regarded as the defect of the memory cell MC.

Since the defect position signal RJ is smaller than the defect position signal LJ, for example, the redundancy signal switch circuit RSWCNT illustrated in FIG. 2 replaces the defect position signals RJ and LJ with each other. For example, the bit line illustrated in FIG. 14 may be wired as a single bit line or as a bit line pair. The data lines D0 to D7 may also be wired as complementary signal lines.

Figure 15:
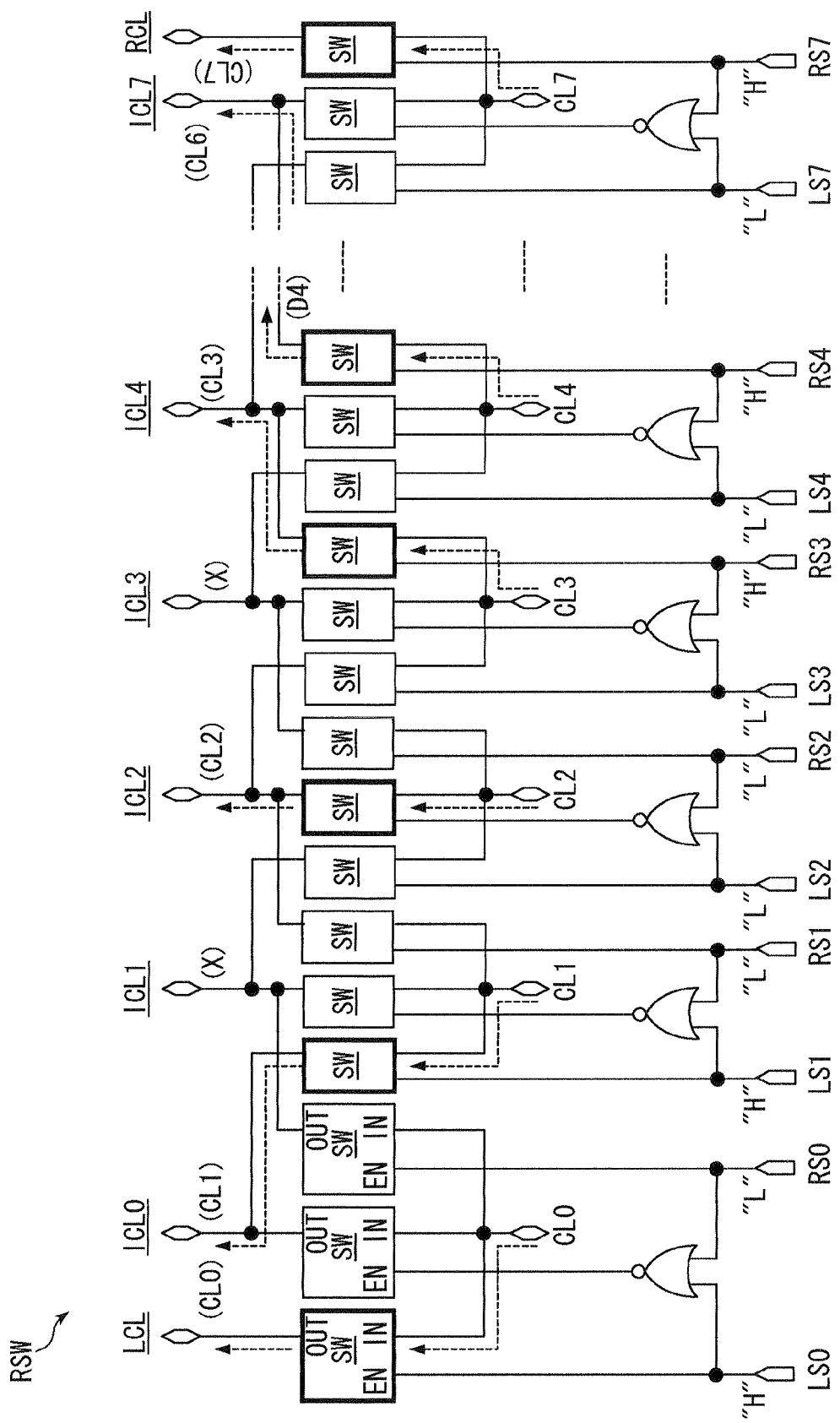
FIG. 15 illustrates an exemplary redundancy switch circuit.

FIG. 15 illustrates an exemplary redundancy switch circuit that generates internal column selection signals and redundant column selection lines LCL and RCL. The redundancy switch circuit may generate the internal column selection signals ICL0 to ICL7 and the redundant column selection lines LCL and RCL illustrated in FIG. 14. The column selection signals CL0 to CL7 are transmitted to the redundancy switch circuit RSW via the switch circuits SW. Other configurations are substantially the same as or similar to those illustrated in FIG. 5.

The fuse decoder FSDEC sets the selection signals LS0 and LS1 and RS3 to RS7 to a high level, while setting the selection signals LS2 to LS7 and RS0 to RS2 to a low level. The switch circuits SW indicated by the bold frames in FIG. 15 are turned ON. As indicated by the broken arrows, the regular column selection lines CL0 to CL7 are respectively coupled to the redundant column selection line LCL, the internal column selection lines ICL0, ICL2, and ICL4 to ICL7, and the redundant column selection line RCL. For example, the redundancy signal switch circuit illustrated in FIGS. 11, 12, and 13 may be applied to the redundancy signal switch circuit RSWCNT of the semiconductor memory MEM illustrated in FIGS. 4 and 15.

The fifth variation provides a substantially similar effect to those in the previous variations. The defect of the semiconductor memory MEM, which switches the column selection lines CL to perform shift redundancy, is effectively remedied by using a redundant circuit, irrespective of the position of defect detected by an operation test.

Figure 16:
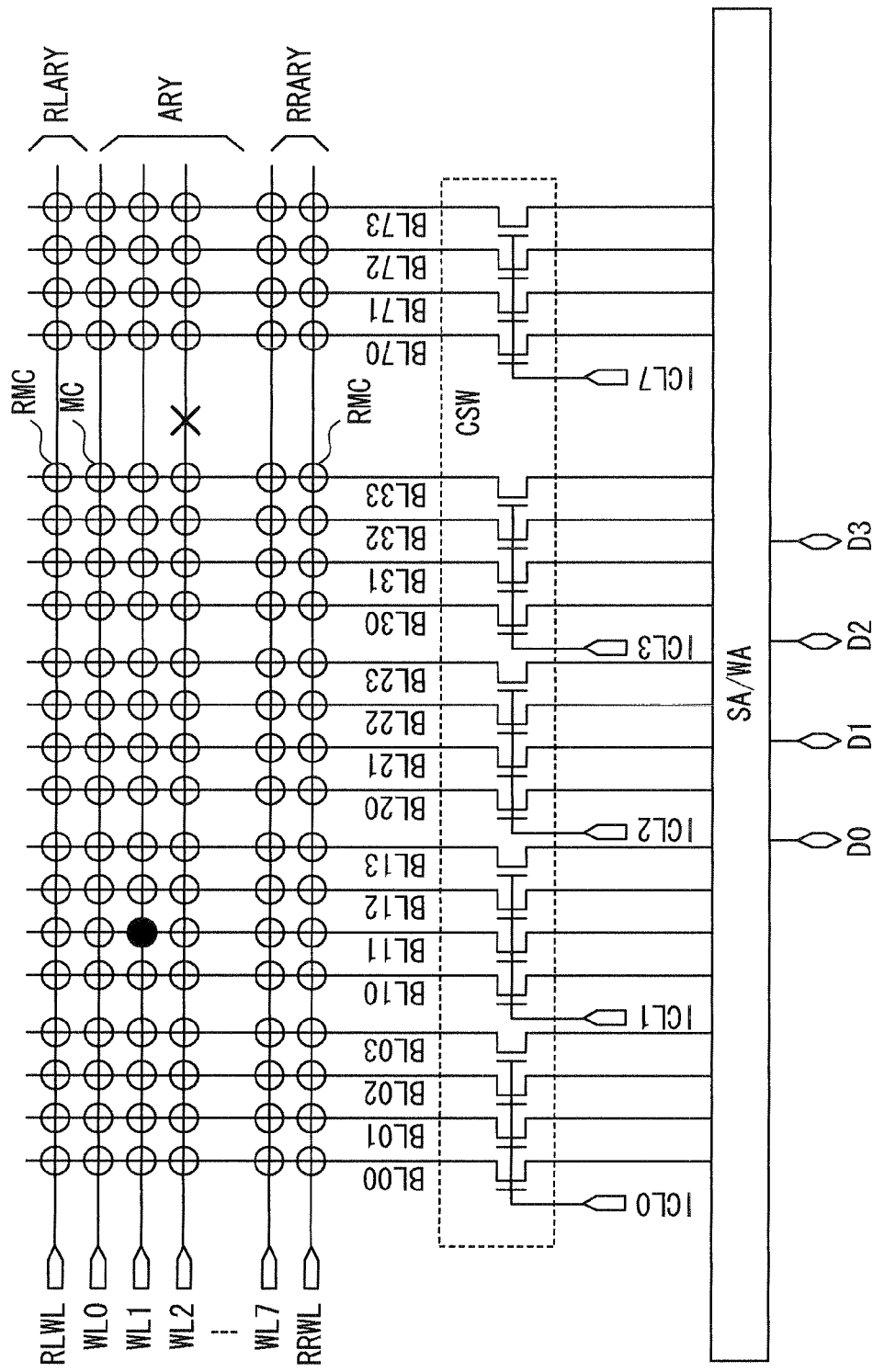
FIG. 16 illustrates various exemplary features in accordance with a sixth variation.

FIG. 16 illustrates a sixth variation containing exemplary cell arrays ARY, RLARY, and RRARY. The same reference numerals and signs are assigned to elements similar to those in the previous variations, and the detailed description thereof is omitted or shortened. Configurations other than the cell arrays ARY, RLARY, and RRARY may be similar to those illustrated in FIG. 1, 2 or 6. The semiconductor memory MEM may be an SRAM. The test system TSYS illustrated in FIG. 7 may be applied. In the test flow, signal lines to be switched by the redundancy switch circuit RSW are word lines WL0 to WL7. Other processes in the test flow are substantially the same as or similar to those illustrated in FIG. 8.

The regular cell array ARY includes, for example, the eight regular word lines WL0 to WL7. The redundant cell array RLARY includes a redundant word line RLWL and the redundant memory cells RMC coupled to the redundant word line RLWL. The redundant cell array RRARY includes a redundant word line RRWL and the redundant memory cells RMC coupled to the redundant word line RRWL. The cell arrays illustrated in FIG. 16 may not include a redundant circuit such as a redundant bit line. The configurations of the bit line BL and the column switch CSW are substantially the same as or similar to those illustrated in FIG. 14.

The redundancy switch circuit RSW is disposed in the word control circuit WLCNT. For example, the redundancy switch circuit RSW is formed by replacing the column selection lines ICL0 to ICL7, LCL, and RCL with the word lines WL0 to WL7, RLWL, and RRWL in FIG. 15, and replacing the column selection lines CL0 to CL7 with the original word lines which are generated by the raw address RAD. The redundancy signal switch circuit RSWCNT and the fuse decoder RSDEC may be substantially the same as or similar to the redundancy signal switch circuit RSWCNT and the fuse decoder RSDEC illustrated in FIGS. 2 and 6. The defect position information LJ or RJ indicative of a defective word line WL is programmed into the redundancy program circuit LFUSE or RFUSE.

For example, the regular memory cell MC indicated by the black circle in FIG. 16 includes a defect, and the word line WL2 indicated by the mark X in FIG. 16 includes a defect. For example, the defects may be detected by the test system illustrated in FIG. 7. The defect of the word line WL2 may be detected in, for example the redundancy determination test PT1 illustrated in FIG. 8. In the process 104, the defect position information LJ indicative of the word line WL2 is programmed into the redundancy program circuit LFUSE as the defect position information LJ. The defect of the memory cell MC indicated by the black circle may be detected in, for example, the redundancy determination test PT2 illustrated in FIG. 8. In the process 114, the value indicative of the word line WL1 corresponding to the defect is programmed into the redundancy program circuit RFUSE as the defect position information RJ.

When the memory cell MC is defective, the defect position signals LJ and RJ indicate the position of the word line WL coupled to the defective memory cell MC. The defect of the memory cell MC may be regarded as the defect of the word line WL. The defect of the word line WL may be regarded as the defect of the memory cell MC.

Since the defect position signal RJ is smaller than the defect position signal LJ, the redundancy signal switch circuit RSWCNT illustrated in FIG. 2, for example, replaces the defect position signals RJ and LJ with each other. The eight original word lines generated by the raw address RAD are respectively coupled to the redundant word line RLWL, the word lines WL0 and WL3 to WL7, and the redundant word line RRWL. The redundancy signal switch circuit illustrated in FIGS. 11, 12, and 13 may be applied to the redundancy signal switch circuit RSWCNT of the semiconductor memory MEM illustrated in FIG. 16, for example.

The sixth variation provides a substantially similar effect to those in the above-described variations. The defect of the semiconductor memory MEM, which switches the word lines WL to perform shift redundancy, is effectively remedied by using a redundant circuit irrespective of the position of defect detected by an operation test.

In the variations, the adder ADD1 compares the defect position information LJ and RJ with each other. Further, the adder ADD2 subtracts 1 from the defect position information RJ. However, the comparison of the defect position information LJ and RJ or the operation of the defect position information RJ may be performed by a subtractor or other logic circuits.

In the variations, a redundant circuit for remedying one defect is arranged on both sides of the regular cell array ARY. However, a plurality of redundant circuits for remedying one defect may be arranged or both sides of the regular cell array ARY. At least one defect may be remedied by using a redundant circuit arranged on one side based on the redundancy determination test PT1 while at least one defect may be remedied by using a redundant circuit arranged on the other side based on the redundancy determination test PT2. The semiconductor memory MEM may have the redundancy signal switch circuit RSWCNT, which replaces defect position signals with each other when a defect detected by the redundancy determination test PT2 is located between any position of defect detected by the redundancy determination test PT1 and a redundancy program circuit, which is programmed based on the redundancy determination test PT1. When the redundancy signal switch circuit RSWCNT remedies a defect by using a redundant circuit, the switching paths of data lines, column selection lines, and word lines do not cross one another. Even when a plurality of redundant circuits are arranged on one side of the regular cell array ARY, the defect position signals are compared, and the redundancy signal switch circuit RSWCNT replaces the defect position signals with each other, so that the switching paths do not cross one another.

The previous variations are applied to an SRAM. However, the previous variations may be applied to a DRAM, flash memory, ferroelectric memory, ReRAM, or the like which performs shift redundancy.

Example variations of the present invention have now been described in accordance with the above advantages. It will be appreciated that these examples are merely illustrative of aspects of the invention. Many variations and modifications will be apparent to those skilled in the art.

The invention claimed is:

1. A semiconductor memory comprising:
    a plurality of regular memory cells;
    a first redundant memory cell which is arranged at one end of a region of the regular memory cells;
    a second redundant memory cell which is arranged at the other end of the region of the regular memory cells;
    a first redundancy program circuit corresponding to the first redundant memory cell, wherein first defect position information indicating a position of a first defective regular memory cell is programmed into the first redundancy program circuit;
    a second redundancy program circuit corresponding to the second redundant memory cell, wherein second defect position information indicating a position of a second defective regular memory cell is programmed into the second redundancy program circuit;
    a redundancy switch circuit which couples signal lines to the regular memory cell, the first redundant memory cell, and the second redundant memory cell in response to the first defect position information and the second defect position information; and
    a redundancy signal switch circuit which replaces the first defect position information and the second defect position information with each other when the second defective regular memory cell is located between the first defective regular memory cell and the first redundant memory cell.

2. The semiconductor memory according to claim 1, wherein the redundancy switch circuit uses the first redundant memory cell and the second redundant memory cell in response to the first defect position information and the second defect position information.

3. The semiconductor memory according to claim 1, wherein the redundancy switch circuit sequentially couples the signal lines to the regular memory cells, the first redundant memory cell, and the second redundant memory cell while avoiding a defective regular memory cell.

4. The semiconductor memory according to claim 1, further comprising:
    a defect position shift circuit which converts the second defect position information to third defect position information by shifting the second defect position information to the first redundant memory cell side by a given number when the second defective regular memory cell is located between the first regular memory cell and the first redundant memory cell.

5. The semiconductor memory according to claim 4, wherein the given number includes 1.

6. The semiconductor memory according to claim 1, further comprising:
    a determination circuit which activates a switch signal when detecting that the second defective regular memory cell is located between the first defective regular memory cell and the first redundant memory cell,
    wherein the redundancy signal switch circuit replaces the first defect position information and the second defect position information with each other based on the switch signal.

7. The semiconductor memory according to claim 1, further comprising:
    a switch program circuit which is programmed to activate a switch signal when the second defective regular memory cell is located between the first defective regular memory cell and the first redundant memory cell,
    wherein the redundancy signal switch circuit replaces the first defect position information and the second defect position information with each other based on the switch signal.

8. The semiconductor memory according to claim 1, further comprising
    regular bit lines coupled to the regular memory cells;
    a first redundant bit line coupled to the first redundant memory cell; and
    a second redundant bit line coupled to the second redundant memory cell,
    wherein the first defect position information and the second defect position information include information relating to a regular bit line coupled to a defective regular memory cell; and
    wherein the signal lines include regular bit lines coupled to the regular memory cells, and data lines coupled to the first redundant bit line and the second redundant bit line.

9. The semiconductor memory according to claim 1, further comprising:
    regular bit lines coupled to the regular memory cells;
    regular column switches coupled to the regular bit lines;
    a first redundant bit line coupled to the first redundant memory cell;
    a first redundant column switch coupled to the first redundant bit line;
    a second redundant bit line coupled to the second redundant memory cell; and
    a second redundant column switch coupled to the second redundant bit line,
    wherein the first defect position information and the second defect position information include information relating to a regular column switch coupled to a regular bit line corresponding to the first defective regular memory cell and the second defective regular memory cell, and
    wherein the signal lines include column selection lines coupled to the regular column switches coupled to the regular bit lines corresponding to the regular memory cells, the first redundant column switch, and the second redundant column switch.

10. The semiconductor memory according to claim 1, further comprising:
    regular word lines coupled to the regular memory cells;
    a first redundant word line coupled to the first redundant memory cell; and
    a second redundant word line coupled to the second redundant memory cell,
    wherein the first defect position information and the second defect position information include information relating to a regular word line coupled to a defective regular memory cell, and
    wherein the signal lines include regular word lines coupled to the regular memory cells, the first redundant word line, and the second redundant word line.

* * * * *